United States Patent
Horisaki et al.

(10) Patent No.: US 10,957,400 B1
(45) Date of Patent: Mar. 23, 2021

(54) MEMORY SYSTEM

(71) Applicant: KIOXIA CORPORATION, Tokyo (JP)

(72) Inventors: Koji Horisaki, Yokohama Kanagawa (JP); Kazuhisa Horiuchi, Yokohama Kanagawa (JP); Ryo Yamaki, Yokohama Kanagawa (JP); Gibeom Park, Yokohama Kanagawa (JP); Youyang Ng, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/802,477

(22) Filed: Feb. 26, 2020

(30) Foreign Application Priority Data

Sep. 9, 2019  (JP) .............................. JP2019-163969

(51) Int. Cl.
*G11C 16/26* (2006.01)
*G11C 16/12* (2006.01)
*G11C 16/34* (2006.01)
*G06F 13/16* (2006.01)

(52) U.S. Cl.
CPC .......... *G11C 16/26* (2013.01); *G06F 13/1668* (2013.01); *G11C 16/12* (2013.01); *G11C 16/3404* (2013.01); *G11C 16/349* (2013.01)

(58) Field of Classification Search
CPC ... G11C 16/26; G11C 16/349; G11C 16/3404; G11C 16/12; G06F 13/1668
See application file for complete search history.

(56) References Cited

U.S. PATENT DOCUMENTS

| | | | | |
|---|---|---|---|---|
| 8,149,623 | B2* | 4/2012 | Uchikawa | G11C 16/34 365/185.18 |
| 8,964,464 | B2* | 2/2015 | Weingarten | G11C 11/5642 365/185.03 |
| 9,069,659 | B1 | 6/2015 | Sabbag et al. | |
| 2010/0146191 | A1 | 6/2010 | Katz | |
| 2014/0365836 | A1 | 12/2014 | Jeon et al. | |
| 2017/0039003 | A1* | 2/2017 | Hara | G06F 11/1048 |
| 2017/0308432 | A1* | 10/2017 | Hsiao | G11C 16/26 |
| 2019/0108092 | A1* | 4/2019 | Lee | G06F 11/1012 |
| 2019/0130968 | A1 | 5/2019 | Tokutomi et al. | |
| 2020/0075110 | A1* | 3/2020 | Suzuki | G11C 16/3459 |
| 2020/0091942 | A1* | 3/2020 | Horisaki | G11C 16/26 |

OTHER PUBLICATIONS

U.S. Appl. No. 16/286,521, filed Feb. 26, 2019.

* cited by examiner

*Primary Examiner* — Tri M Hoang
(74) *Attorney, Agent, or Firm* — Kim & Stewart LLP

(57) ABSTRACT

A memory controller performs a reference read on a plurality of memory cells using reference read voltages, generates a histogram indicating the number of memory cells in different threshold voltage bins based on results of the reference read, estimates actual read voltages based on the histogram and a first estimation function, and reads data using the actual read voltages. When reading of the data with the actual read voltages estimated using the first estimation function fails, the memory controller estimates actual read voltages using a second estimation function different from the first estimation function and reads the data with the actual read voltages estimated using the second estimation function.

17 Claims, 15 Drawing Sheets

HISTOGRAM (8 BINS) 400

ESTIMATION FUNCTION
(8 ROWS × 7 COLUMNS)
300(301,302)

```
┌─────────────────────────────────────────┐ ⎫ 600
│                                         │
│   NUMBER OF EXECUTIONS OF P/E CYCLE     │
│                   or                    │
│   NUMBER OF EXECUTIONS OF READ OPERATION│
│                   or                    │
│   ELAPSED TIME SINCE DATA IS PROGRAMMED │
│                   or                    │
│                TEMPERATURE              │
│                                         │
└─────────────────────────────────────────┘
```

MEMORY SYSTEM

CROSS-REFERENCE TO RELATED APPLICATION(S)

This application is based upon and claims the benefit of priority from Japanese Patent Application No. 2019-163969, filed Sep. 9, 2019, the entire contents of which are incorporated herein by reference.

FIELD

Embodiments described herein relate generally to a memory system.

BACKGROUND

There is known a memory system including a non-volatile memory cell. In a read operation in this memory system, based on a comparison between a threshold voltage of the memory cell and a read voltage, data stored in the memory cell is determined.

There are various factors that cause changes in memory cell threshold voltage. The memory system is configured to be capable of changing the read voltage so that correct data can be read from the memory cell even when the threshold voltage of the memory cell changes.

DESCRIPTION OF THE DRAWINGS

FIG. 16 is a diagram illustrating an example of a configuration of management information recorded by a memory controller according to a ninth embodiment.

DETAILED DESCRIPTION

Embodiments provide a memory system with high convenience.

In general, according to one embodiment, a memory system includes a plurality of memory cells and a controller. Data is stored in the plurality of memory cells. The controller executes a first reference read operation, a first counting process, a first estimation process, and a first actual read operation. The first reference read operation is a process of performing a read on the plurality of memory cells by using one or more first reference read voltages. The first counting process is a process of generating a first histogram indicating the number of memory cells in different threshold voltage bins based on a result of the first reference read operation. The first estimation process is a process of estimating one or more actual read voltages based on the first histogram and a first estimation function. The first actual read operation is a process of reading the data by using the one or more actual read voltages obtained by the first estimation process. When the first actual read operation fails, the controller executes a second estimation process and a second actual read operation. The second estimation process is a process of estimating the one or more actual read voltages by using a second estimation function different from the first estimation function. The second actual read operation is a process of reading the data by using the one or more actual read voltages estimated by the second estimation process.

Hereinafter, a memory system related to embodiments will be described in detail with reference to drawings. The present disclosure is not limited by these embodiments.

First Embodiment

Figure 1:
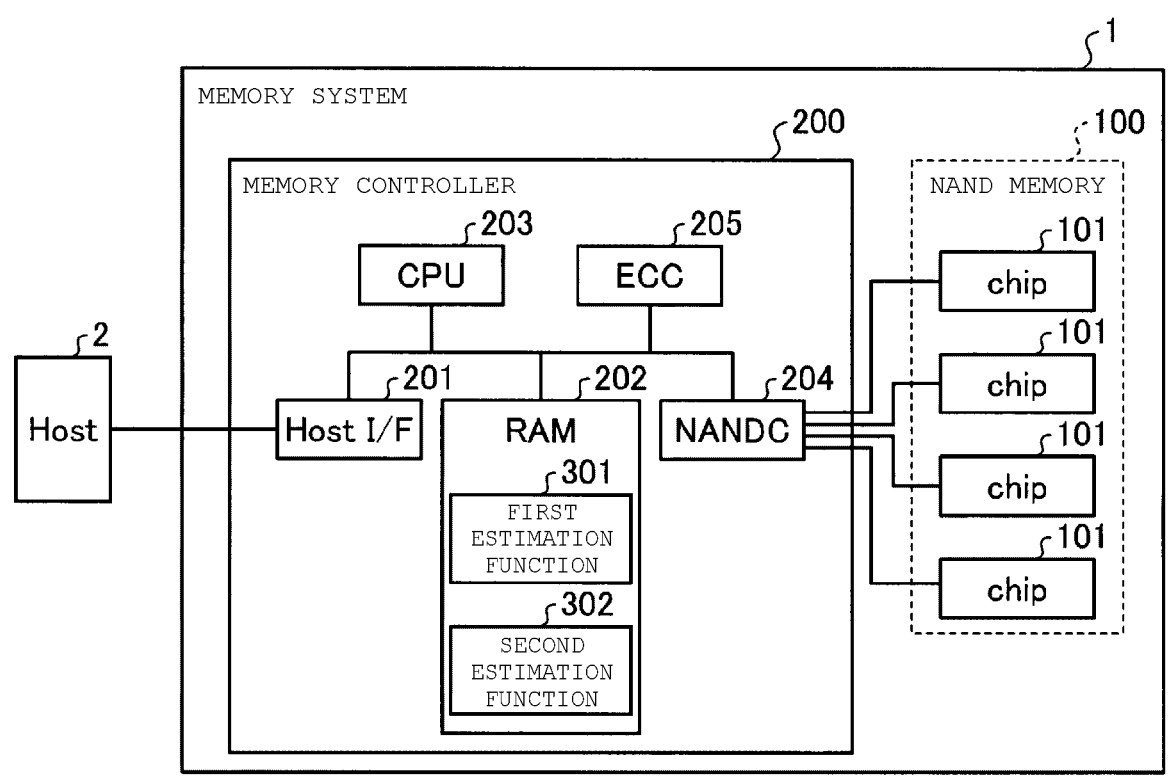
FIG. 1 is a schematic diagram illustrating a configuration example of a memory system according to a first embodiment.

FIG. 1 is a schematic diagram illustrating a configuration example of a memory system according to a first embodiment. The memory system 1 is configured to be connectable with a host 2. The host 2 corresponds to, for example, a personal computer, a portable information terminal, a server, or the like.

The memory system 1 may receive an access request (e.g., a read request or a write request) from the host 2.

The memory system 1 includes a NAND flash memory (NAND memory) 100 and a memory controller 200 which executes data transmission between the host 2 and the NAND memory 100.

The memory controller 200 includes a host interface (Host I/F) 201, a random access memory (RAM) 202, a central processing unit (CPU) 203, a NAND interface (NANDC) 204, and an error correction circuit (ECC) 205.

The memory controller 200 is configured as, for example, a system-on-a-chip (SoC). The memory controller 200 may include a plurality of chips. For example, the RAM 202 is a chip different from the chip of the memory controller 200. Further, the memory controller 200 may include a field-programmable gate array (FPGA) or an application specific integrated circuit (ASIC) instead of the CPU 203. That is, the memory controller 200 may be implemented by software, hardware, or a combination thereof.

The RAM 202 is a memory used as a buffer or a work area of the CPU 203. A type of a memory in the RAM 202 is not limited to a specific type. For example, the RAM 202 includes a dynamic random access memory (DRAM), a static random access memory (SRAM), or a combination thereof.

The host interface 201 controls a communication interface with the host 2. The host interface 201 executes data transmission between the host 2 and the RAM 202 under the control of the CPU 203. The NANDC 204 executes data transmission between the NAND memory 100 and the RAM 202 under the control of the CPU 203.

The CPU 203 controls the host interface 201, the RAM 202, the NANDC 204, and the ECC 205. The CPU 203 controls the various components described above by executing a firmware program.

The ECC 205 encodes data transmitted to the NAND memory 100. Encoding is encoding using an error correction code. The ECC 205 decodes data transmitted from the NAND memory 100, and detects and corrects a bit error in the data.

A method of the encoding used by the ECC 205 is not limited to a specific method. In one example, a low density parity check (LDPC) may be employed as the encoding method.

The NAND memory 100 includes one or more memory chips 101. Here, as an example, the NAND memory 100 includes four memory chips 101.

Figure 2:
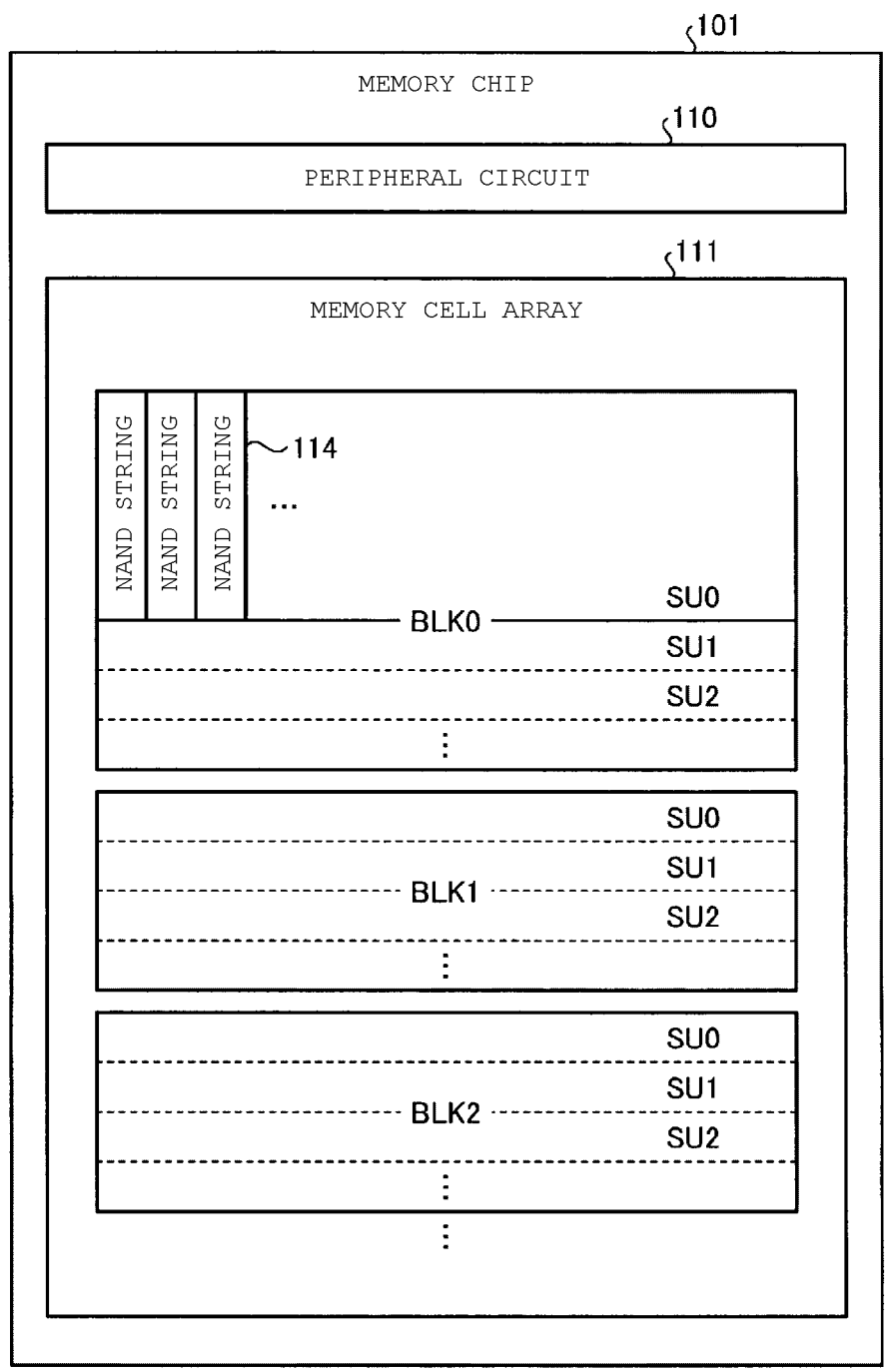
FIG. 2 is a schematic diagram illustrating a configuration example of a memory chip according to the first embodiment.

FIG. 2 is a schematic diagram illustrating a configuration example of the memory chip 101 according to the first embodiment. As illustrated, the memory chip 101 includes a peripheral circuit 110 and a memory cell array 111.

The memory cell array 111 includes a plurality of blocks BLK (BLK0, BLK1, . . . ) each of which is a set of a plurality of non-volatile memory cell transistors. Each block BLK includes a plurality of string units SU (SU0, SU1, . . . ) each of which is a set of memory cell transistors associated with word lines and bit lines. Each string unit SU includes a plurality of NAND strings 114 in which memory cell transistors are connected in series. The number of NAND strings 114 in the string unit SU may be any number.

The peripheral circuit 110 includes, for example, a row decoder, a column decoder, a sense amplifier, a latch circuit, and a voltage generation circuit. When receiving a command from the memory controller 200, the peripheral circuit 110 executes a process corresponding to the command among a program process, a read operation, and an erase process, on the memory cell array 111.

Figure 3:
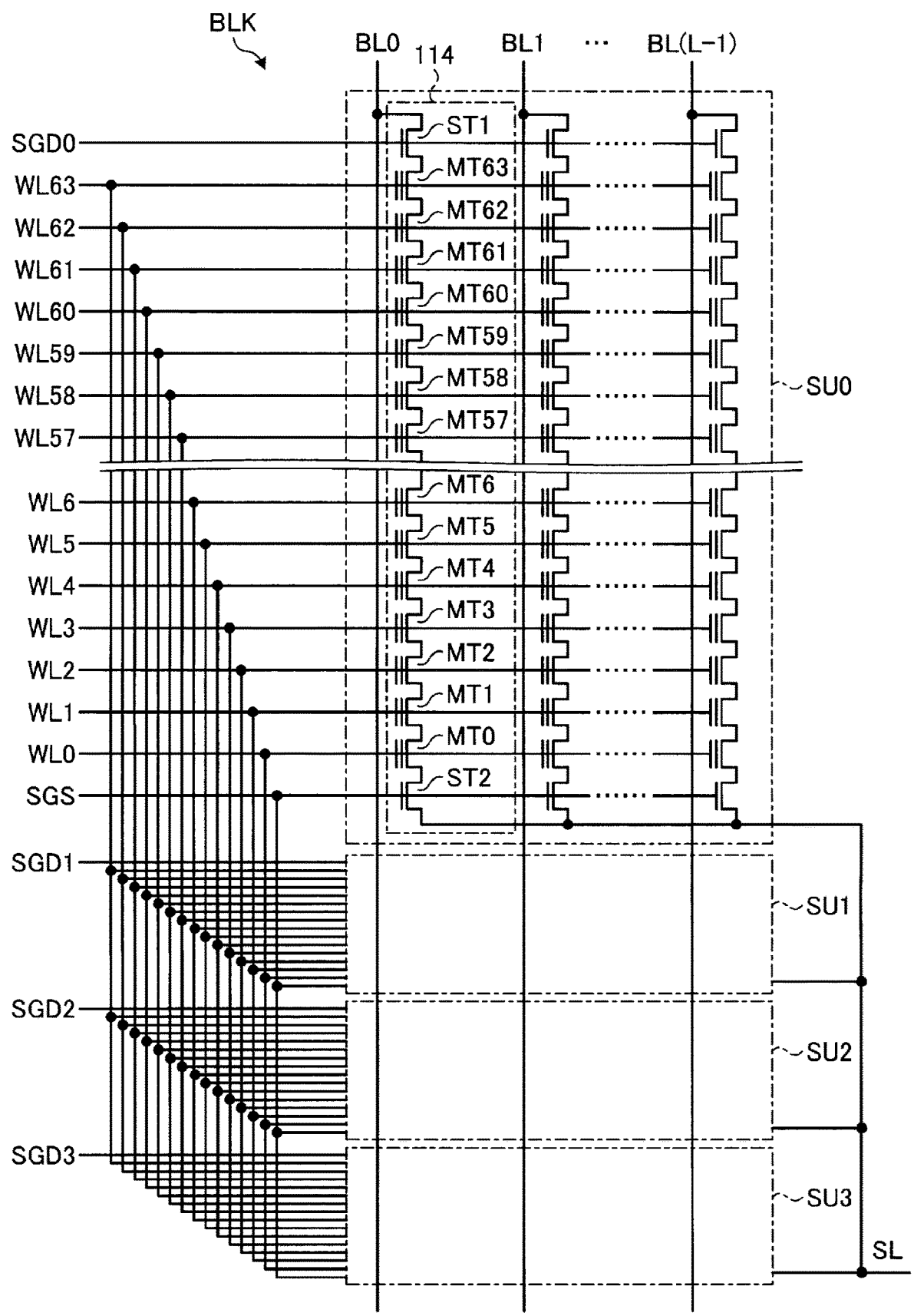
FIG. 3 is a schematic diagram illustrating a circuit configuration of a block according to the first embodiment.

FIG. 3 is a schematic diagram illustrating a circuit configuration of the block BLK according to the first embodiment. Each block BLK has the same configuration. For example, the block BLK includes four string units SU0 to SU3. Each string unit SU includes the plurality of NAND strings 114.

Each NAND string 114 includes, for example, 64 memory cell transistors MT (MT0 to MT63) and select transistors ST1 and ST2. The memory cell transistor MT includes a control gate and a charge storage layer, and holds data in a non-volatile manner. The 64 memory cell transistors MT (MT0 to MT63) are connected in series between a source of the select transistor ST1 and a drain of the select transistor ST2. The memory cell transistor MT may be a MONOS type using an insulating film in a charge storage layer or an FG type using a conductive film in a charge storage layer.

Further, the number of memory cell transistors MT in the NAND string 114 is not limited to 64.

Gates of the select transistors ST1 of the string units SU0 to SU3 are respectively connected with select gate lines SGD0 to SGD3. On the other hand, gates of the select transistors ST2 in the string units SU0 to SU3 are commonly connected to, for example, a select gate line SGS. The gates of the select transistors ST2 of the string units SU0 to SU3 may be connected to select gate lines SGS0 to SGS3 different from one another for each string unit SU. Control gates of the memory cell transistors MT0 to MT63 in the same block BLK are respectively connected to word lines WL0 to WL63 for each block BLK.

Drains of the select transistors ST1 of the NAND strings 114 in the string unit SU are respectively connected to different bit lines BL (BL0 to BL(L−1), and L is a natural number equal to or more than 2). The bit lines BL are commonly connected to one NAND string 114 in each string unit SU across the plurality of blocks BLK. Further, sources of the select transistors ST2 are commonly connected to the source line SL.

That is, the string unit SU is a set of the NAND strings 114 connected to the different bit lines BL and connected to the same select gate line SGD. Further, the block BLK is a set of the plurality of string units SU having common word lines WL. The memory cell array 111 is a set of the plurality of blocks BLK having common bit lines BL.

A program process and a read operation by the peripheral circuit 110 may be collectively performed on the memory cell transistors MT connected to one word line WL in one string unit SU. A set of 1-bit data obtained by executing the program process or the read operation on one word line WL in one string unit SU may be referred to as a "page".

An erase process by the peripheral circuit 110 is executed in units of a block BLK. That is, all data stored in one block BLK is collectively erased.

Figure 4:
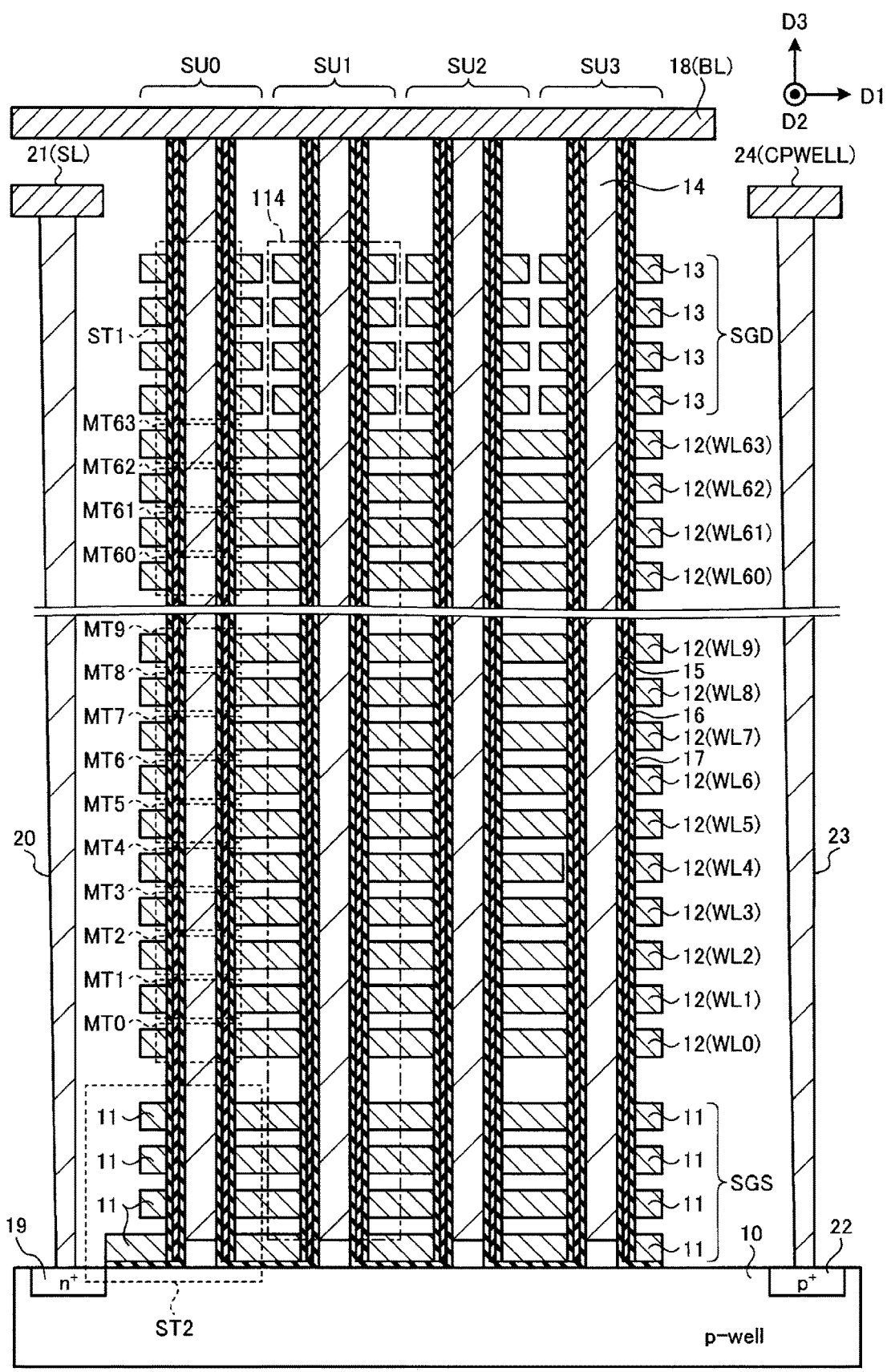
FIG. 4 is a cross-sectional view of a partial area of the block according to the first embodiment.

FIG. 4 is a cross-sectional view of a partial area of the block BLK according to the first embodiment. As illustrated in FIG. 4, the plurality of NAND strings 114 are formed on a p-type well area (more generally referred to as a semiconductor substrate) 10. That is, on the well area 10, for example, four wiring layers 11 functioning as the select gate lines SGS, 64 wiring layers 12 functioning as the word lines WL0 to WL63, and four wiring layers 13 functioning as the select gate lines SGD are sequentially stacked. An insulating film (not illustrated) is formed between the stacked wiring layers.

A pillar-shaped semiconductor 14 which penetrates through the wiring layers 13, 12, and 11 and reaches the well area 10 is formed. On a side surface of the semiconductor 14, agate insulating film 15, a charge storage layer (an insulating film or a conductive film) 16, and a block insulating film 17 are sequentially formed, so the memory cell transistor MT and select transistors ST1 and ST2 are formed. The semiconductor 14 functions as a current path of the NAND string 114 and becomes an area in which a channel of each transistor is formed. An upper end of the semiconductor 14 is connected to a metal wiring layer 18 which functions as the bit line BL.

An n+ type impurity diffusion layer 19 is formed in a surface area of the well area 10. A contact plug 20 is formed on the diffusion layer 19, and the contact plug 20 is connected to a metal wiring layer 21 which functions as the source line SL. Further, a p+ type impurity diffusion layer 22 is formed in a surface area of the well area 10. A contact plug 23 is formed on the diffusion layer 22, and the contact plug 23 is connected to a metal wiring layer 24 which functions as a well wiring CPWELL. The well wiring CPWELL is a wiring for applying a voltage to the conductor 14 via the well area 10.

A plurality of the above configurations are arranged in a second direction D2 parallel to the semiconductor substrate, and the string unit SU is formed by a set of the plurality of NAND strings 114 arranged in the second direction D2.

The configuration illustrated in FIGS. 2 to 4 is an example. The configuration of the memory cell array 111 is not limited to the configuration described above. For example, the memory cell array 111 may have a configuration in which NAND strings 114 are two-dimensionally arranged.

Hereinafter, the memory cell transistor MT is simply referred to as a memory cell.

Figure 5:
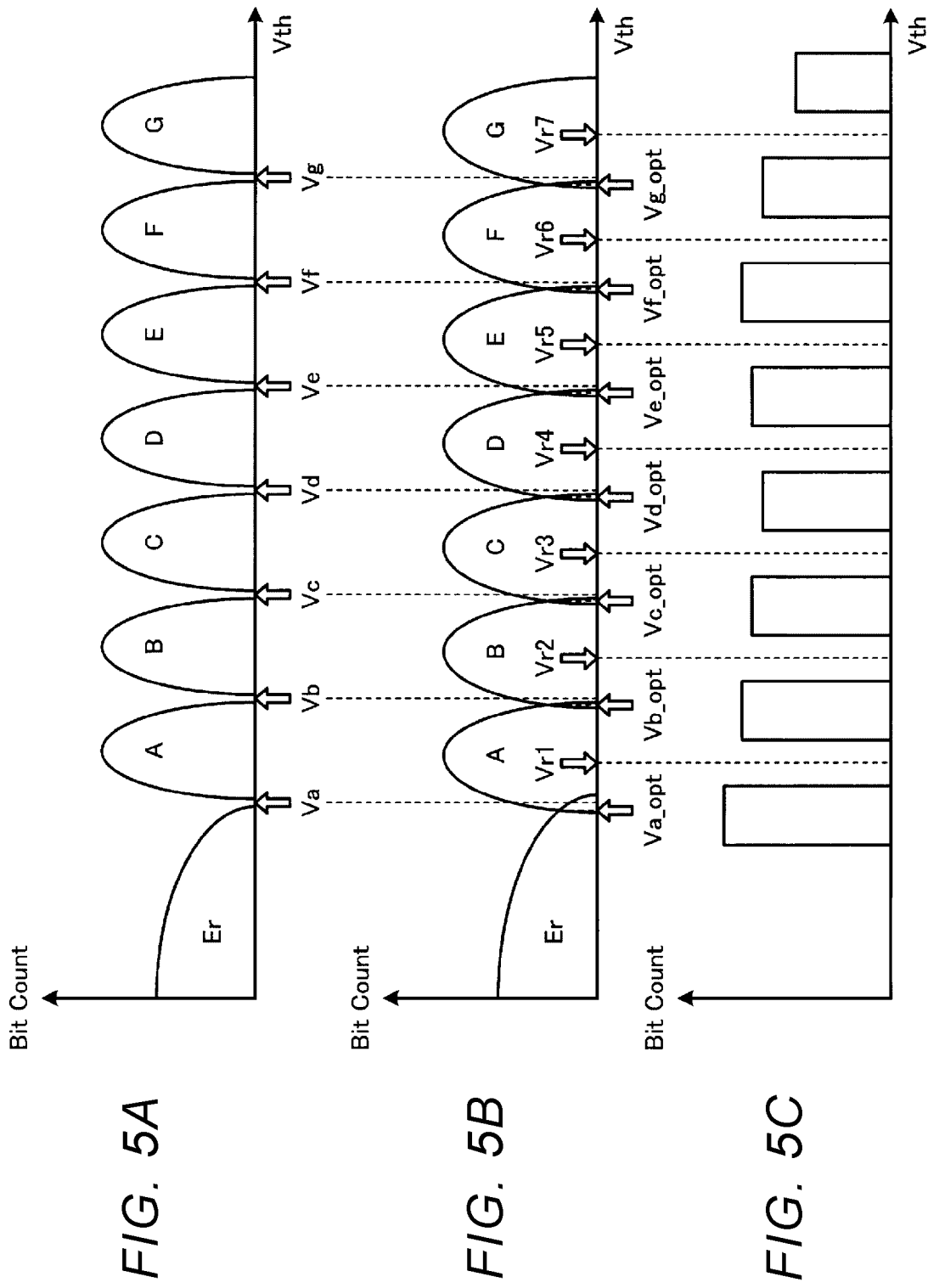
FIGS. 5A, 5B, and 5C are schematic diagrams illustrating an example of distribution of threshold voltages of a memory cell according to the first embodiment.

FIGS. 5A, 5B, and 5C are schematic diagrams illustrating an example of distribution of threshold voltages of a memory cell according to the first embodiment. In the three graphs in FIGS. 5A, 5B, and 5C, a vertical axis represents the number of memory cells (bit count), and a horizontal axis represents a threshold voltage (Vth). Here, as an example, a method called a triple level cell (TLC) is applied as a method for storing data in each memory cell. According to the TLC method, each memory cell may store 3-bit data.

In a case of the TLC, an obtainable range of the threshold voltage is divided into eight ranges. The eight ranges are referred to as an "Er" state, an "A" state, a "B" state, a "C" state, a "D" state, an "E" state, an "F" state, and a "G" state in order from the lowest threshold voltage. At the time of the program process, the peripheral circuit 110 controls the threshold voltage of each memory cell so that the threshold voltage belongs to one of the "Er" state, the "A" state, the "B" state, the "C" state, the "D" state, the "E" state, the "F" state, and the "G" state.

As a result, when the number of memory cells is plotted for the threshold voltage, distribution of the threshold voltages of the memory cell forms eight lobes belonging to different states as illustrated in FIG. 5A.

The eight states correspond to different 3-bit data. In one example, the "Er" state corresponds to "111", the "A" state corresponds to "110", the "B" state corresponds to "100", the "C" state corresponds to "000", the "D" state corresponds to "010", the "E" state corresponds to "011", the "F" state corresponds to "001", and the "G" state corresponds to "101". In this manner, each memory cell may store data corresponding to the state to which the threshold voltage belongs.

The threshold voltage is lowered to the "Er" state by an erase process. Further, by a program process, the threshold voltage is maintained in the "Er" state or is raised to one of the "A" state, the "B" state, the "C" state, the "D" state, the "E" state, the "F" state, and the "G" state.

A voltage for determining data is set at a boundary between two adjacent states. In order to distinguish this voltage from a reference read voltage to be described below, this voltage is referred to as an actual read voltage. In addition, a read operation for determining data using the actual read voltage is referred to as an actual read operation.

For example, as illustrated in FIG. 5A, an actual read voltage Va is set between the "Er" state and the "A" state, an actual read voltage Vb is set between the "A" state and the "B" state, an actual read voltage Vc is set between the "B" state and the "C" state, an actual read voltage Vd is set between the "C" state and the "D" state, an actual read voltage Ve is set between the "D" state and the "E" state, an actual read voltage Vf is set between the "E" state and the "F" state, and an actual read voltage Vg is set between the "F" state and the "G" state. That is, in a TLC mode in which eight states are set, actual read voltages with seven points are set. In the read operation, the peripheral circuit 110 specifies a state to which a memory cell belongs by using actual read voltages with a plurality of points, and decodes the specified state into data.

There are various factors that cause changes in the threshold voltage of the memory cell. When some or all of lobes of the threshold voltage exceed the actual read voltage at the boundary between states, a data determination error occurs. That is, a value different from that at the time of the program process is read. The value different from that at the time of the program process is referred to as a bit error.

The memory controller 200 may deal with the bit error by error correction by the ECC 205 and shifting of the actual read voltage.

For example, the memory controller 200 performs error correction using the ECC 205 on data obtained from the NAND memory 100. When the error correction fails, the memory controller 200 estimates optimum values of the actual read voltages Va to Vg and sets the optimum values of the actual read voltages Va to Vg obtained by the estimation as new settings of the actual read voltages Va to Vg so as to retry the read operation.

The optimum values of the actual read voltages Va to Vg are values of the actual read voltages Va to Vg which can reduce an occurrence rate of bit errors as much as possible.

FIG. 5B illustrates distribution of threshold voltages obtained after the memory system 1 is used for a while after the distribution illustrated in FIG. 5A is obtained. As illustrated in FIG. 5B, eight lobes corresponding to different states are different in shape and position from the eight lobes illustrated in FIG. 5A. Widths of the eight lobes overlap with each other, and one continuous distribution is formed. When such distribution is obtained, it is considered that an occurrence rate of bit errors can be minimized by setting seven minimum points in the distribution as the actual read voltages Va to Vg. That is, Va_opt, Vb_opt, Vc_opt, Vd_opt, Ve_opt, Vf_opt, and Vg_opt correspond to the optimum values of the actual read voltages Va to Vg in distribution of states in FIG. 5B.

The optimum values of the actual read voltages Va to Vg may not be minimum points of the distribution, for example, values for minimizing the occurrence rate of bit errors.

In the first embodiment and the embodiments to be described below, the memory controller 200 performs a read by using predetermined reference read voltages with one or more points, so a histogram indicating the number of memory cells for the threshold voltage is obtained. The memory controller 200 estimates optimum values of the actual read voltages Va to Vg based on the obtained histogram and an estimation function. The estimation function is a function indicating a correspondence between various histograms and the optimum values of the actual read voltages Va to Vg. The memory controller 200 performs a read by using estimation values of the actual read voltages Va to Vg obtained by the estimation.

In the example of FIG. 5B, seven reference read voltages Vr1, Vr2, Vr3, Vr4, Vr5, Vr6, and Vr7 are preset.

When a reference read voltage Vri (i is an integer from 1 to 7) is applied to a word line, among a group of memory cells connected to the word line, a memory cell having a threshold voltage lower than the Vri is turned on and a memory cell having a threshold voltage higher than the Vri is turned off. Whether the memory cell is in an on state or an off state is determined by a sense amplifier in the peripheral circuit 110.

The memory controller 200 causes the peripheral circuit 110 to sequentially apply the reference read voltages Vr1, Vr2, Vr3, Vr4, Vr5, Vr6, and Vr7 to the target word line and to determine whether each memory cell for each reference read voltage is turned on or off. This process may be executed, for example, when the memory controller 200 transmits seven sets of read commands designating different reference read voltages between Vr1 to Vr7 to the memory chip 101 including the target word line. That is, the read operation is executed seven times while changing the read voltage. The memory controller 200 obtains a reference read result indicating whether each memory cell is in an on state or an off state for each reference read voltage, from the memory chip 101. The memory controller 200 counts the number of memory cells in a predetermined state of the on state and the off state among the plurality of memory cells connected to the target word line. Based on the count value obtained for each reference read voltage, the memory controller 200 sets eight sections divided by the reference read voltages Vr1, Vr2, Vr3, Vr4, Vr5, Vr6, and Vr7 as bins and generates a histogram with the number of memory cells as a frequency.

For example, if the number of memory cells in the on state when the reference read voltage Vri is applied is referred to as Ci, and the number of memory cells connected to the target word line is referred to as Cmt, a frequency of a section divided by Vrj and Vr(j+1) may be obtained by calculation of C(j+1)−Cj. Meanwhile, j is an integer from 1 to 6. A frequency of a section smaller than Vr1 is C1. A frequency of a section larger than Vr7 is Cmt−C7.

FIG. 5C is a schematic diagram illustrating a histogram obtained by the above process.

The reference read voltages Vr1 to Vr7 are preset. A method of setting the reference read voltages Vr1 to Vr7 is not limited to a specific method.

For example, an initial value of each of the seven actual read voltages Va to Vg may be predetermined, and the memory controller 200 may set each actual read voltage in the peripheral circuit 110 by using a difference from the initial value of each actual read voltage. In such a case, the initial values of the seven actual read voltages Va to Vg may be used as the seven reference read voltages Vr1 to Vr7.

In the example of FIGS. 5A, 5B, and 5C, the number of reference read voltages is equal to the number of actual read voltages. Alternatively, the number of reference read voltages may be different from the number of actual read voltages. For example, the number of reference read voltages may be three, and the memory controller 200 may generate a histogram having four bins by using the three reference read voltages and obtain seven actual read voltages Va to Vg based on the histogram.

In this specification, a set of one or more read operations, which is executed to generate a histogram, using one or more reference read voltages (for example, the reference read voltages Vr1 to Vr7) is referred to as a reference read operation.

Figure 6:
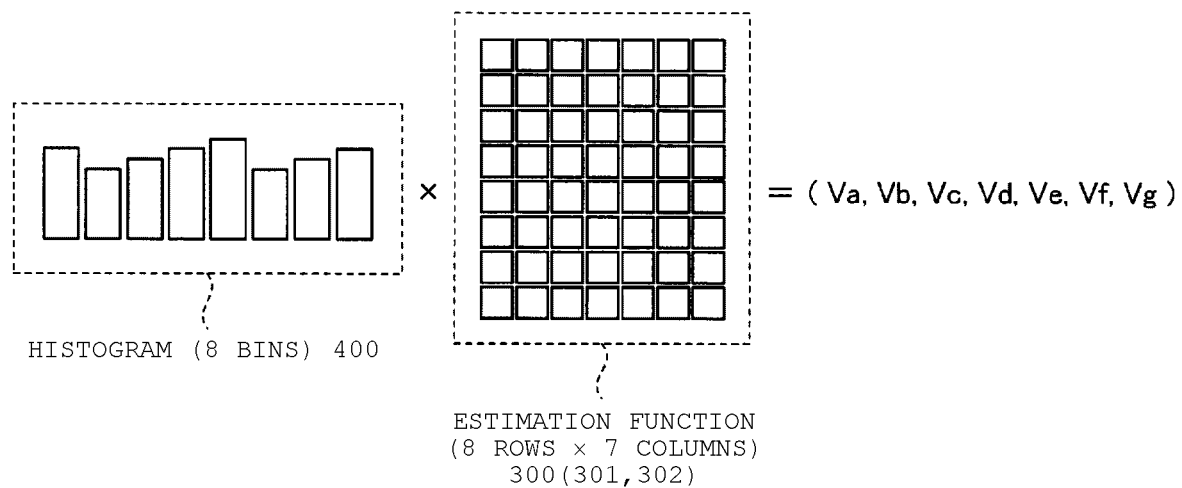
FIG. 6 is a schematic diagram for illustrating an example of a configuration of an estimation function according to the first embodiment.

FIG. 6 is a schematic diagram for illustrating an example of a configuration of an estimation function according to the first embodiment. In the example in FIG. 6, an estimation function 300 is a matrix having 8 rows and 7 columns. The number of rows of the estimation function 300 is equal to the number of bins of a histogram (e.g., histogram 400) obtained by the reference read operation. The number of columns of the estimation function 300 is equal to the estimated number of actual read voltages. The memory controller 200 calculates a vector having seven elements by multiplying the estimation function 300 from a right side of the vector having a value (a frequency) of each bin of the histogram 400 as an element. The seven elements of the vector correspond to estimation values of the optimum values of the actual read voltages Va to Vg.

The estimation function 300 is generated as follows.

For example, from one or more sample products of the memory chip 101, a large number of pairs of a histogram and a set of optimum values of the seven actual read voltages Va to Vg are obtained while varying a stress condition of the memory chip 101. For example, one or more sample products of the memory chip 101 are connected to a test apparatus, and the test apparatus performs a test in which an actual use of the memory system 1 is simulated. That is, the test apparatus transmits various commands assumed in the actual use with respect to each sample product, in various patterns.

In the test, the sample products are respectively in different states in which stress conditions such as the number of executions of a program and erase cycle (a P/E cycle) and the number of executions of the read operation are different from one another, by changing an access pattern and the like. The program and erase cycle is a pair of a program process and an erase process. The test apparatus obtains a histogram in each state.

That is, the test apparatus causes the peripheral circuit 110 to sequentially apply the reference read voltages Vr1, Vr2, Vr3, Vr4, Vr5, Vr6, and Vr7 to the target word line and to determine whether each memory cell for each reference read voltage is turned on or off. The test apparatus counts the number of memory cells in a predetermined state of the on state and the off state for each reference read voltage, among the plurality of memory cells connected to the target word line. Based on the count value obtained for each reference read voltage, the test apparatus sets eight sections divided by the reference read voltages Vr1, Vr2, Vr3, Vr4, Vr5, Vr6, and Vr7 as bins and generates a histogram with the number of memory cells as a frequency.

The test apparatus obtains an optimum value of the actual read voltage when obtaining the histogram from the sample product. A method of obtaining the optimum value of the actual read voltage is not limited to a specific method. The optimum value of the actual read voltage may be obtained, for example, by executing a distribution read. The distribution read is an operation of measuring distribution of threshold voltages of memory cells as illustrated in FIG. 5B, for example, by observing the number of memory cells in an on state and the number of memory cells in an off state, connected to a word line while shifting a voltage applied to the word line by a predetermined step width. The test apparatus specifies seven minimum points from the distribution of the threshold voltages of the memory cells obtained by the distribution read, and obtains the seven specified minimum points as optimum values of the actual read voltage. A method of obtaining the optimum value of the actual read voltage is not limited thereto.

The test apparatus outputs the histogram and a set of the optimum values of the actual read voltage obtained when the histogram is obtained.

As described above, a pair of the histogram and the set of the optimum values of the actual read voltage is collected, and the estimation function 300 of correlating the histogram with the set of the optimum values of the actual read voltage is generated by using a large number of collected pairs. That is, the estimation function 300 is a regression model in which a histogram is an explanatory variable and a set of optimum values of actual read voltages is an objective variable.

Meanwhile, there are many types of stresses of changing the threshold voltage, and the degree of each stress varies. The type of stress and the degree of stress are referred to as stress conditions. When estimation of an optimum value of an actual read voltage under a wide range of stress conditions is to be performed by one estimation function, accuracy of the estimation of the optimum value of the actual read voltage is degraded.

In order to prevent deterioration in accuracy of the estimation of the optimum value of the actual read voltage, according to the first embodiment, a plurality of estimation functions assumed to be used under different stress conditions are provided.

Figure 7:
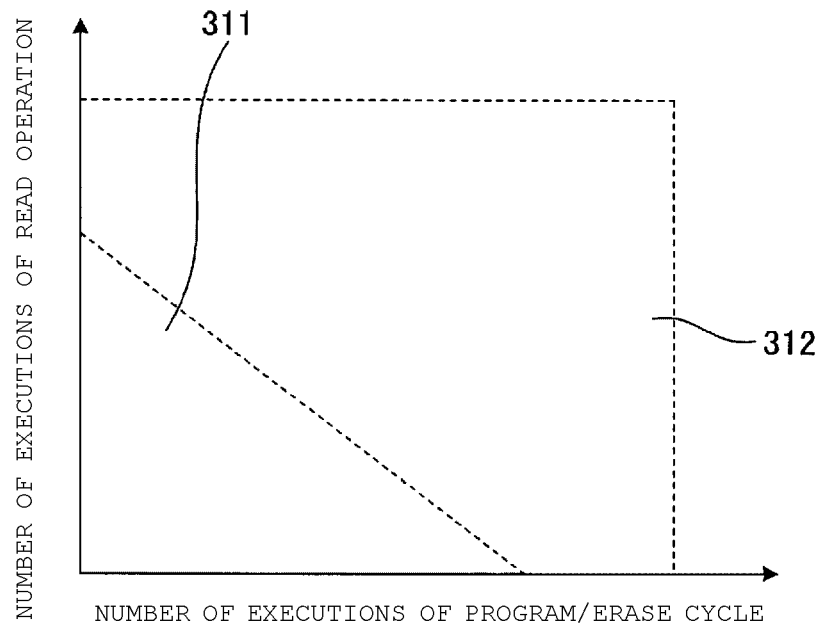
FIG. 7 is a schematic diagram for illustrating an example of a plurality of stress conditions in which a plurality of estimation functions according to the first embodiment are respectively set.

FIG. 7 is a schematic diagram for illustrating an example of a plurality of stress conditions in which a plurality of estimation functions according to the first embodiment are respectively set.

Execution of a program and erase cycle or execution of a read operation wears a memory cell. As the wear of the memory cell progresses, the threshold voltage tends to fluctuate. In FIG. 7, the number of times the program and erase cycle is executed and the number of times the read operation is executed are listed as examples of types of the stress. The read operation in FIG. 7 is typically an actual read operation. Meanwhile, the read operation in FIG. 7 may include a reference read operation.

As illustrated in FIG. 7, as an example, a range 311 and a range 312 indicating a stress condition stronger than the range 311 are defined. A first estimation function 301 for estimating an optimum value of an actual read voltage under a stress condition covering a range 311 and a second estimation function 302 for estimating an optimum value of the actual read voltage under a stress condition covering a range 312 are provided.

For example, the first estimation function 301 is generated based on a pair of a histogram and a set of optimum values of the actual read voltage obtained under the stress condition in the range 311. Therefore, according to the first estimation function 301, when the memory cell is under the stress condition in the range 311, the optimum value of the actual read voltage can be accurately estimated from the histogram.

In addition, for example, the second estimation function 302 is generated based on a pair of a histogram and a set of optimum values of the actual read voltage obtained under the stress condition in the range 312. Therefore, according to the second estimation function 302, when the memory cell is under the stress condition in the range 312, the optimum value of the actual read voltage can be accurately estimated from the histogram.

The first estimation function 301 and the second estimation function 302 are used as follows. That is, the memory controller 200 first obtains a histogram and performs estimation using the histogram and the first estimation function 301. The memory controller 200 performs an actual read operation using an actual read voltage obtained by the estimation using the first estimation function 301.

When data cannot be obtained by the actual read operation using the actual read voltage obtained by the estimation using the first estimation function 301, that is, when error correction for the data read by the actual read operation fails, there is a possibility that a stress condition of a target memory cell may have deviated from the range 311. The memory controller 200 performs estimation using the second estimation function 302. The memory controller 200 performs the actual read operation using the actual read voltage obtained by the estimation using the second estimation function 302 again. If the stress condition of the target memory cell is within the range 312, there is a high possibility that correct data may be obtained by the actual read operation using the actual read voltage obtained by the estimation using the second estimation function 302.

In this manner, even when the stress condition of the memory cell deviates from the range 311, data can be correctly read. In addition, since a plurality of estimation functions 300 having different ranges of stress conditions to be covered are used, as compared with the case where only one estimation function is used, it is possible to prevent deterioration in accuracy of estimation of the optimum value of the actual read voltage.

Further, in the first embodiment, the first estimation function 301 and the second estimation function 302 are configured so that a common histogram can be input. For example, the first estimation function 301 and the second estimation function 302 have the same number of rows. If the memory controller 200 obtains a histogram once, the memory controller 200 may use the histogram for both of the estimation by the first estimation function 301 and the estimation by the second estimation function 302. Accordingly, it is possible to reduce the number of times the reference read operation is executed.

The first estimation function 301 and the second estimation function 302 are stored in a non-volatile memory (for example, the NAND memory 100) before shipping the memory system 1, for example. When the memory system 1 is started up, the memory system 1 is loaded into the RAM 202. The memory controller 200 may use the first estimation function 301 and the second estimation function 302 loaded in the RAM 202.

In the description of the first embodiment, the first estimation function 301 and the second estimation function 302 have the same configuration as that of the estimation function 300 in FIG. 6. In the first embodiment, the first estimation function 301 and the second estimation function 302 are matrices of 8 rows and 7 columns, and optimum values of the seven actual read voltages Va to Vg may be estimated from a histogram having 8 bins.

Next, an operation of the memory system 1 according to the first embodiment will be described.

Figure 8:
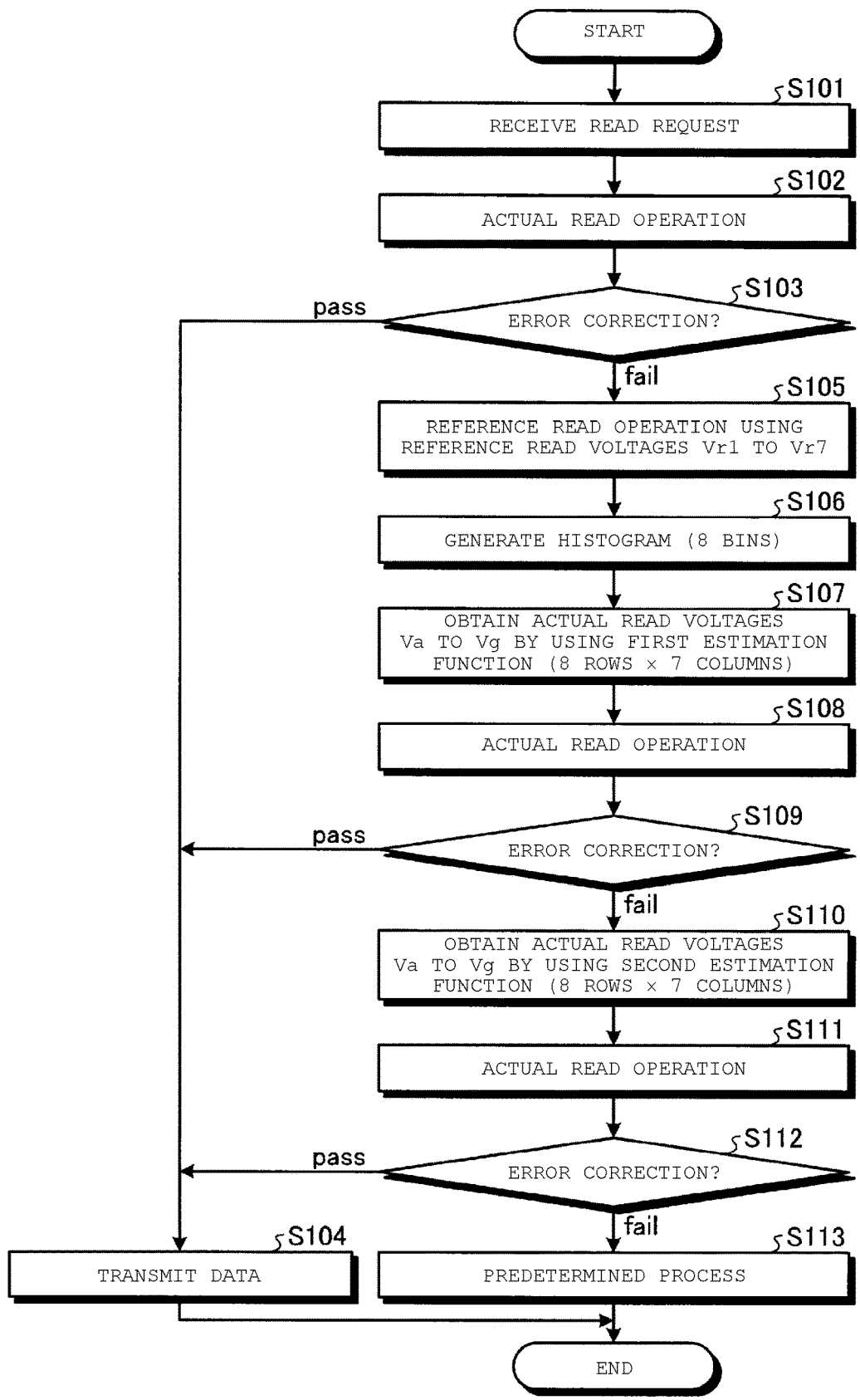
FIG. 8 is a flowchart for illustrating an operation example of the memory system according to the first embodiment.

FIG. 8 is a flowchart for illustrating an operation example of the memory system 1 according to the first embodiment.

When the memory system 1 receives a read request from the host 2 (S101), the memory controller 200 executes an actual read operation of obtaining data requested by the read request from the NAND memory 100 (S102). A value of an actual read voltage used in the actual read operation in S102 is preset by a predetermined method. For example, an initial value of the actual read voltage is used. Alternatively, the same value as that used when the actual read operation is last executed on the same position (such as a word line, a block, or the like) is used as the actual read voltage.

The memory controller 200 causes the ECC 205 to execute error correction on the data obtained from the NAND memory 100 by the actual read operation (S103). When the error correction is successful (pass in S103), the memory controller 200 transmits the data to the host 2 (S104) and terminates the operation.

When the error correction fails (fail in S103), the memory controller 200 executes a reference read operation using the reference read voltages Vr1 to Vr7 (S105). Specifically, the memory controller 200 designates different values of Vr1 to Vr7 as read voltages, and causes the memory chip 101 to execute seven read operations in total. The memory controller 200 stores seven pieces of data obtained by the seven read operations, for example, in the RAM 202. These seven pieces of data are referred to as a result of the reference read operation.

Next, the memory controller 200 (for example, the CPU 203) generates a histogram having 8 bins based on the result of the reference read operation (S106).

The memory controller 200 (for example, the CPU 203) obtains the actual read voltages Va to Vg by using the first estimation function 301 (S107). In the same manner as the estimation function 300 in FIG. 6, for example, the first estimation function 301 is configured as a matrix having 8 rows and 7 columns. The CPU 203 multiplies a vector having a frequency of each bin of the histogram obtained by the process in S106 as an element by the first estimation function 301, so it is possible to obtain a vector having an estimation value of each optimum value of the actual read voltages Va to Vg as an element.

Next, the memory controller 200 executes the actual read operation again by using the actual read voltages Va to Vg obtained by the process in S107 (S108). In the same manner as the process in S103, the error correction is performed on the data obtained from the NAND memory 100 in the process in S108 (S109).

When the error correction is successful (pass in S109), the memory controller 200 executes the process in S104. When the error correction fails (fail in S109), the memory controller 200 (for example, the CPU 203) obtains the actual read voltages Va to Vg by using the second estimation function 302 (S110). The second estimation function 302 has the same configuration as that of the first estimation function 301. Meanwhile, the second estimation function 302 is generated based on a pair of a histogram obtained from a range of stress conditions different from that of the first estimation function 301 and a set of optimum values of the actual read voltage. In the process in S110, the CPU 203 multiplies a vector having a frequency of each bin of the histogram obtained by the process in S106 as an element by the second estimation function 302, so it is possible to obtain a vector having an estimation value of each optimum value of the actual read voltages Va to Vg as an element.

Next, the memory controller 200 executes the actual read operation again by using the actual read voltages Va to Vg obtained by the process in S110 (S111). In the same manner as the process in S103, the error correction is performed on the data obtained from the NAND memory 100 in the process in S111 (S112).

When the error correction is successful (pass in S112), the memory controller 200 executes the process in S104. When the error correction fails (fail in S112), the memory controller 200 executes a predetermined process (S113) and terminates the operation.

The predetermined process may be freely selected. For example, the predetermined process may be a process of notifying the host 2 that error correction is not possible.

Alternatively, regarding the predetermined process, the error correction may be performed by a method different from S103, S109, or S112. For example, an LDPC supports hard and soft determination. The hard determination has a lower error correction strength than the soft determination, and can execute error correction at a high speed. The soft determination has a higher error correction strength than the hard determination, and takes a longer time for the error correction. For example, when the LDPC is adopted as an encoding method of the ECC 205, the ECC 205 performs hard determination in S103, S109, and S112. When the error correction fails in the process in S112, that is, when hard determination error correction fails, the memory controller 200 may execute soft determination as a predetermined process.

In the above description, the memory controller 200 may use the two estimation functions 301 and 302. In the first embodiment and the following embodiments, the memory controller 200 may be configured to use three or more estimation functions. In the first embodiment, for example, when the error correction in S112 fails, the memory controller 200 may perform estimation using another estimation function different from both of the first estimation function 301 and the second estimation function 302.

Further, in the above, an example in which a TLC is applied as a method of storing data in each memory cell is described. By changing the number of columns of the estimation functions 301 and 302, the first embodiment and the following embodiments may be applied to a memory system to which a certain method for holding data of 2 bits or more in each memory cell is applied.

For example, as the method for storing data in each memory cell, there is a method called a quad level cell (QLC) for storing 4-bit data in each memory cell. According to the QLC, 15 actual read voltages are used to specify each of 16 states. Therefore, for example, each of the estimation functions 301 and 302 includes 15 columns to estimate the 15 actual read voltages. The number of reference read voltages may or may not be equal to the number of actual read voltages (that is, 15 points).

Further, in the above, a series of processes for estimating the actual read voltage (for example, the processes in S105 to S113) are executed when the read request from the host 2 is processed. The trigger for estimating the actual read voltage is not limited to the process of the read request from the host 2.

For example, the memory controller 200 may execute garbage collection (compaction), wear leveling, refresh, or the like. These processes include a read operation (an actual read operation) from the NAND memory 100. The memory controller 200 may be configured to execute the actual read operation in garbage collection, wear leveling, or refresh and execute a series of processes for estimating the actual read operation (for example, the processes of S105 to S113) at the time when error correction of data obtained by the actual read operation fails.

Alternatively, the memory controller 200 is configured to obtain and store an actual read voltage at which data can be correctly read by executing the processes in S105 to S113 at a timing or the like of an access request being disconnected from the host 2 and execute an actual read operation by using the stored actual read voltage when a read request is received from the host 2.

Further, in the above description, the first estimation function 301 covers the stress condition in the range 311, and the second estimation function 302 covers the stress condition in the range 312. The range covered by each of the estimation functions 301 and 302 is not limited to this. The range covered by the first estimation function 301 and the range covered by the second estimation function 302 may partially overlap with each other.

In this manner, according to the first embodiment, the memory controller 200 executes the reference read operation by using one or more reference read voltages (for example, S105), obtains a histogram indicating the number of memory cells for the threshold voltage based on a result of the reference read operation (for example, S106), estimates one or more actual read voltages based on the histogram and the first estimation function 301 (S107), and execute the actual read operation by using the one or more actual read voltages (S108). When data cannot be obtained by the actual read operation (fail in S109), the memory controller 200 estimates one or more actual read voltages by using the second estimation function 302 different from the first estimation function 301 (S110) and executes the actual read operation by using the one or more actual read voltages (S111).

Therefore, the optimum value of the actual read voltage can be estimated with high accuracy under a wide range of the stress conditions. That is, convenience is improved.

Further, in the first embodiment, the same histogram is used for both of estimation using the first estimation function 301 and estimation using the second estimation function 302.

Therefore, when a histogram is obtained once, it is possible to perform estimation using the second estimation function 302 without obtaining the histogram again, so that a total time required for the process of the read request can be reduced.

Second Embodiment

In the first embodiment, the first estimation function 301 and the second estimation function 302 have the same configuration. That is, the first estimation function 301 and the second estimation function 302 are configured as a matrix having 8 rows and 7 columns so that the seven actual read voltages Va to Vg may be obtained from a histogram having 8 bins. The first estimation function 301 and the second estimation function 302 may not have the same configuration. In the second embodiment, an example in which the second estimation function 302 having a configuration different from that of the first estimation function 301 is used will be described.

In the same manner as the first embodiment, the first estimation function 301 is configured so that the seven actual read voltages Va to Vg may be obtained from a histogram having 8 bins. That is, the first estimation function 301 is a matrix having 8 rows and 7 columns.

On the other hand, the second estimation function 302 is configured to obtain some of the seven actual read voltages Va to Vg from a histogram having 8 bins.

In a method in which each memory cell may store data of 2 bits or more, a minimum actual read voltage and a maximum actual read voltage among a plurality of actual read voltages tend to greatly fluctuate as compared with other actual read voltages. Therefore, if only the minimum actual read voltage and the maximum actual read voltage among the plurality of actual read voltages can be estimated more accurately, a probability that data can be read correctly is improved.

In the second embodiment, the second estimation function 302 is configured to obtain an estimation value of an optimum value of Va which is a minimum value among the seven actual read voltages Va to Vg and an estimation value of an optimum value of Vg which is a maximum value among the seven actual read voltages Va to Vg. That is, for example, the second estimation function 302 is a matrix having 8 rows and 2 columns.

For example, the second estimation function 302 is configured to cover a range of stress conditions different from that of the first estimation function 301. For example, the second estimation function 302 is generated based on a pair of a histogram and a set of optimum values of the actual read voltage obtained under the stress condition within the range 312.

When the actual read voltages Va and Vg are estimated by using the second estimation function 302, the memory controller 200 executes an actual read operation by using Vb to Vf among the actual read voltages Va to Vg obtained by using the first estimation function 301 and the actual read voltages Va and Vg obtained by using the second estimation function 302. Hereinafter, the estimation values of the optimum values of the actual read voltages Va and Vg obtained by using the second estimation function 302 are referred to as Va' and Vg'.

Figure 9:
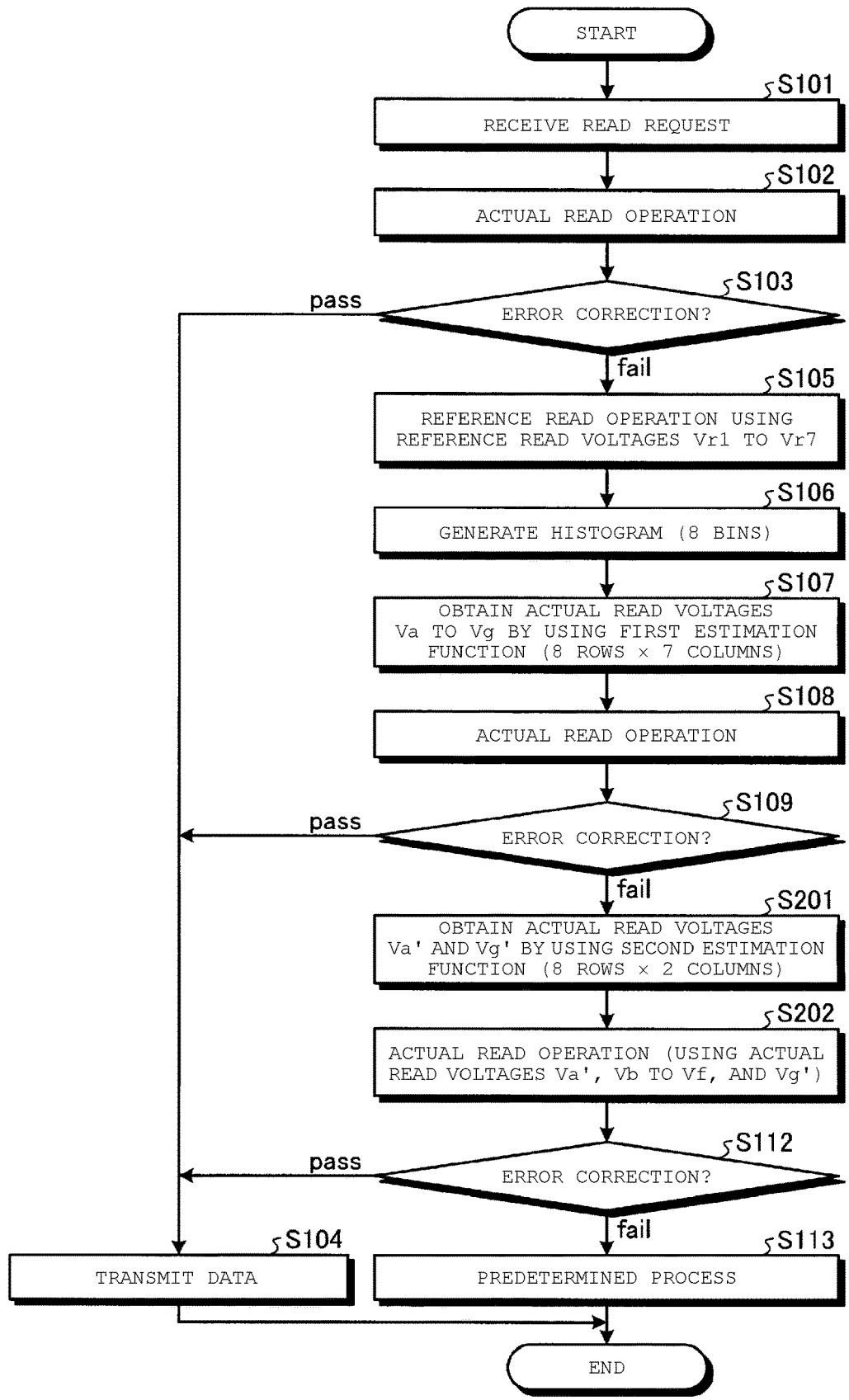
FIG. 9 is a flowchart for illustrating an operation example of a memory system according to a second embodiment.

FIG. 9 is a flowchart for illustrating an operation example of the memory system 1 according to the second embodiment. The same processes as those of the first embodiment are denoted by the same step numbers as those of the first embodiment, and detail description thereof will be omitted.

First, in the same manner as the first embodiment, the processes in S101 to S109 are executed. When the error correction in S109 fails (fail in S109), the memory controller 200 (for example, the CPU 203) obtains the actual read voltages Va' and Vg' by using the second estimation function 302 (S201).

The memory controller 200 executes the actual read operation again by using Vb to Vf among the actual read voltages Va to Vg obtained by the process in S107 and the actual read voltages Va' and Vg' obtained by the process in S201 (S202). The error correction is performed on the data obtained from the NAND memory 100 in the process in S202 (S112).

When the error correction is successful (pass in S112), the memory controller 200 executes the process in S104. When the error correction fails (fail in S112), the memory controller 200 executes the process in S113 and terminates the operation.

In this manner, the memory controller 200 may be configured to estimate only some of the actual read voltages in the estimation using the second estimation function 302.

In the above description, the second estimation function 302 is configured to obtain Va which is a minimum value among the seven actual read voltages Va to Vg and Vg which is a maximum value among the seven actual read voltages Va to Vg. The estimation value of the optimum value of the actual read voltage which may be obtained by the second estimation function 302 is not limited to the example described above. The second estimation function 302 may be configured to obtain an estimation value of an optimum value of one actual read voltage or three or more actual read voltages. Further, the second estimation function 302 may be configured to obtain an estimation value of an optimum value of any actual read voltage different from the maximum value and the minimum value among a plurality of actual read voltages.

Third Embodiment

When the degree of stress received by a memory cell is large, in some cases, a characteristic indicating that the memory cell receives a large stress is represented in a histogram obtained by a reference read operation. For example, when the memory cell receives a large stress and a threshold voltage is likely to fluctuate, distribution of the threshold voltages in all states is uniformly and largely changed in one direction (either the positive direction or the negative direction), so that a histogram in which distribution of frequencies is greatly biased in the same direction may be obtained.

In a situation where it is estimated that the memory cell receives a large stress so that the histogram in which the frequency distribution is greatly biased in one direction is obtained, it is considered that a probability of successful error correction is higher when the second estimation function 302 generated on assumption of use under more severe stress condition is used than when the first estimation function 301 is used.

According to a third embodiment, the memory controller 200 is configured to skip estimation by the first estimation function 301 and the actual read operation using the estimation result by the first estimation function 301 based on the histogram.

Figure 10:
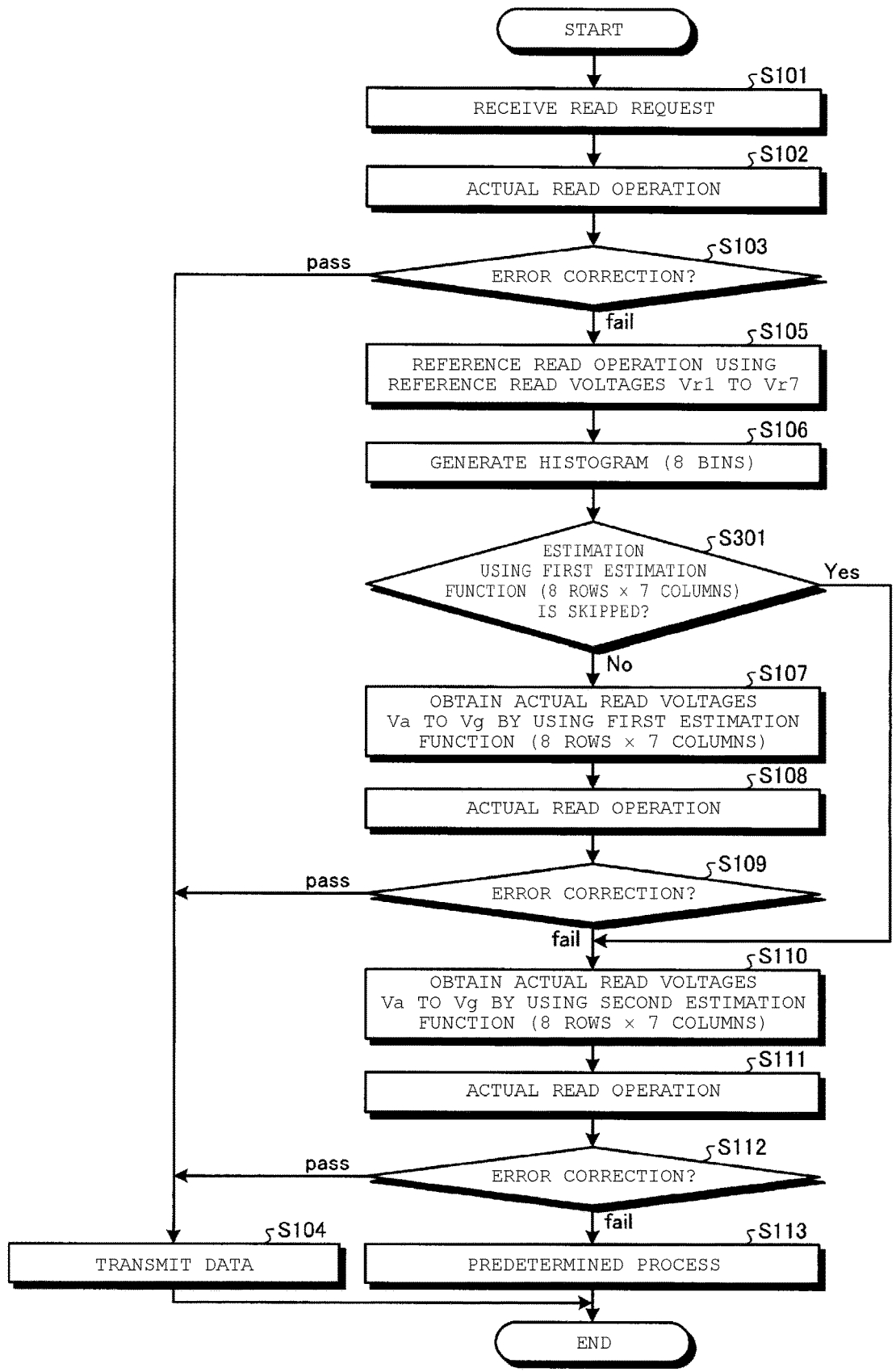
FIG. 10 is a flowchart for illustrating an operation example of a memory system according to a third embodiment.

FIG. 10 is a flowchart for illustrating an operation example of the memory system 1 according to the third embodiment. The same processes as those of the first embodiment are denoted by the same step numbers as those of the first embodiment, and detail description thereof will be omitted.

First, in the same manner as the first embodiment, the processes in S101 to S106 are executed. When a histogram is obtained by the process in S106, the memory controller 200 (for example, the CPU 203) determines whether or not to skip estimation using the first estimation function 301 based on the histogram (S301). A determination method in S301 is not limited to a specific method.

In one example, the CPU 203 performs a product-sum operation on frequencies of all bins of the histogram. A value obtained by the product-sum operation indicates the degree of bias of distribution of threshold voltages in one direction. Therefore, the CPU 203 uses the value obtained by the product-sum operation as an index for determination in S301.

For example, when distribution of the threshold voltages is significantly biased in a positive or negative direction, in some cases, the index exceeds a predetermined upper limit value or is lower than a predetermined lower limit value. In this case, since it is estimated that a memory cell receives a large stress, even if the actual read operation using the actual read voltage obtained by the first estimation function 301 is performed, it is considered that a probability that error correction is successful is low. Therefore, the CPU 203 determines to skip estimation using the first estimation function 301.

On the contrary, when the index is between the predetermined upper limit value and the predetermined lower limit value, it is estimated that the stress received by the memory cell is not large, and the CPU 203 determines not to skip the estimation using the first estimation function 301.

The determination method described above is an example. The CPU 203 may execute the determination in S301 by freely selected methods.

When it is determined that the estimation using the first estimation function 301 is skipped (Yes in S301), the process of obtaining the actual read voltages Va to Vg using the first estimation function (S107), an actual read operation using the actual read voltages Va to Vg obtained by the process in S107 (S108), and an error correction process on data obtained by the actual read operation (S109) are skipped, and a process of obtaining the actual read voltages Va to Vg using the second estimation function 302 is executed (S110). Thereafter, the processes in S111 to S113 are executed.

When it is determined that the estimation using the first estimation function 301 is not skipped (No in S301), the processes in S107 to S113 are executed.

In this manner, the memory controller 200 may determine whether or not to execute estimation using the second estimation function 302 (for example, S110) after skipping a process of estimating an actual read voltage using the first estimation function 301 (for example, S107) and the actual read operation using the actual read voltage (for example, S108), based on a histogram.

Therefore, in a situation where it is estimated that a probability of successful error correction is higher when the second estimation function 302 is used than when the first estimation function 301 is used, various processes related to the first estimation function 301 (S107 to S109) may be skipped. Accordingly, it is possible to reduce a total time required for processing a read request.

When the memory controller 200 is configured to use three or more estimation functions, the memory controller 200 may skip processes until immediately before a process related to a certain estimation function among the three or more estimation functions based on a histogram.

Fourth Embodiment

As described in the third embodiment, a characteristic related to a stress condition may be represented in a histogram. Therefore, it is considered that an estimation function to be used for estimation is selected from a plurality of estimation functions based on a histogram.

According to a fourth embodiment, the memory controller 200 is configured to select an estimation function to be used for estimation from the plurality of estimation functions based on the histogram.

Figure 11:
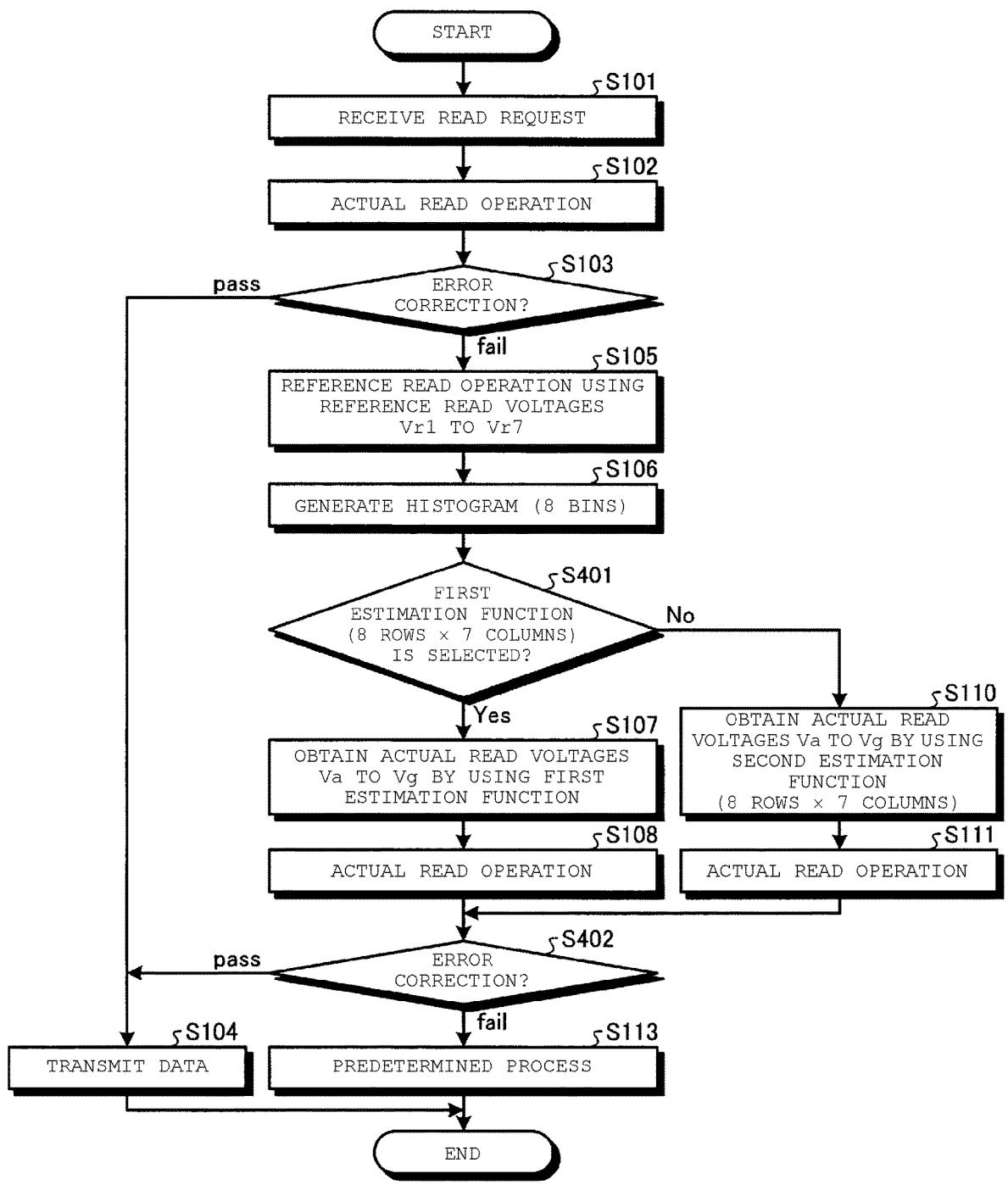
FIG. 11 is a flowchart for illustrating an operation example of a memory system according to a fourth embodiment.

FIG. 11 is a flowchart for illustrating an operation example of the memory system 1 according to the fourth embodiment. The same processes as those of the first embodiment are denoted by the same step numbers as those of the first embodiment, and detail description thereof will be omitted.

First, in the same manner as the first embodiment, the processes in S101 to S106 are executed. When a histogram is obtained by the process in S106, the memory controller 200 (for example, the CPU 203) determines whether or not to select the first estimation function 301 between the first estimation function 301 and the second estimation function 302 based on the histogram obtained by the process in S106 (S401). A determination method in S401 is not limited to a specific method.

In one example, the memory controller 200 executes a product-sum operation of eight constants (m1, m2, m3, m4, m5, m6, m7, and m8) and frequencies (h1, h2, h3, h4, h5, h6, h7, and h8) of all bins of the histogram obtained by the process in S106. The memory controller 200 determines whether or not to select the first estimation function 301 between the first estimation function 301 and the second estimation function 302 based on a comparison between a value obtained by the product-sum operation and a threshold value.

Specifically, for example, the memory controller 200 executes determination in S401 based on whether or not a relationship represented by the following equation (1) is established. Meanwhile, b is the threshold value described above.

$$m1*h1+m2*h2+m3*h3+m4*h4+m5*h5+m6*h6+m7*h7+m8*h8>b \quad (1)$$

When Equation (1) is established, it is determined that the first estimation function 301 is selected. When Equation (1) is not established, it is determined that the first estimation function 301 is not selected. A relationship between establishment or non-establishment of Equation (1) and selection or non-selection of the first estimation function 301 may be opposite to the above.

In another example, in the same manner as the process in S301 in the third embodiment, the CPU 203 may perform a product-sum operation on the frequencies of all bins of the histogram and use the value obtained by the product-sum operation as an index so as to determine whether or not to select the first estimation function 301. For example, when the index is between a predetermined upper limit value and a predetermined lower limit value, the CPU 203 determines to select the first estimation function 301. On the contrary, when the index exceeds the predetermined upper limit value or falls below the predetermined lower limit value, the CPU 203 determines not to select the first estimation function 301. This determination method is an example.

When it is determined that the first estimation function 301 is selected (Yes in S401), the memory controller 200 (for example, the CPU 203) obtains the actual read voltages Va to Vg by using the first estimation function 301 (S107), and executes an actual read operation using the actual read voltages Va to Vg (S108). Error correction is performed on data obtained from the NAND memory 100 in the process in S108 (S402).

When the error correction is successful (pass in S402), the memory controller 200 executes the process in S104. When the error correction fails (fail in S402), the memory controller 200 (for example, the CPU 203) executes a predetermined process (S113) and terminates the operation.

When it is determined that the first estimation function 301 is not selected (No in S401), the memory controller 200 (for example, the CPU 203) obtains the actual read voltages Va to Vg by using the second estimation function 302 (S110), and executes the actual read operation using the actual read voltages Va to Vg (S111). In the same manner as the process in S103, the error correction is performed on the data obtained from the NAND memory 100 in the process in S111 (S112).

When the error correction is successful (pass in S112), the memory controller 200 executes the process in S104. When the error correction fails (fail in S112), the memory controller 200 executes a predetermined process (S113) and terminates the operation.

In the above description, the memory controller 200 selects an estimation function to be used between the two estimation functions 301 and 302. The memory controller 200 may be configured to select an estimation function to be used among three or more estimation functions.

In this manner, the memory controller 200 selects one estimation function from a plurality of estimation functions based on a histogram (for example, S401), and obtains an actual read voltage by using the selected estimation function.

In the same manner as the third embodiment, it is possible to reduce a total time required for processing a read request.

Fifth Embodiment

In the fourth embodiment, when one of a plurality of estimation functions is selected, only estimation using the one selected estimation function is executed. In a fifth embodiment, the memory controller 200 is configured to select an estimation function to be used for first estimation from a plurality of estimation functions, and when error correction fails even if the estimation using the selected estimation function is performed, the memory controller executes estimation using another estimation function.

Figure 12:
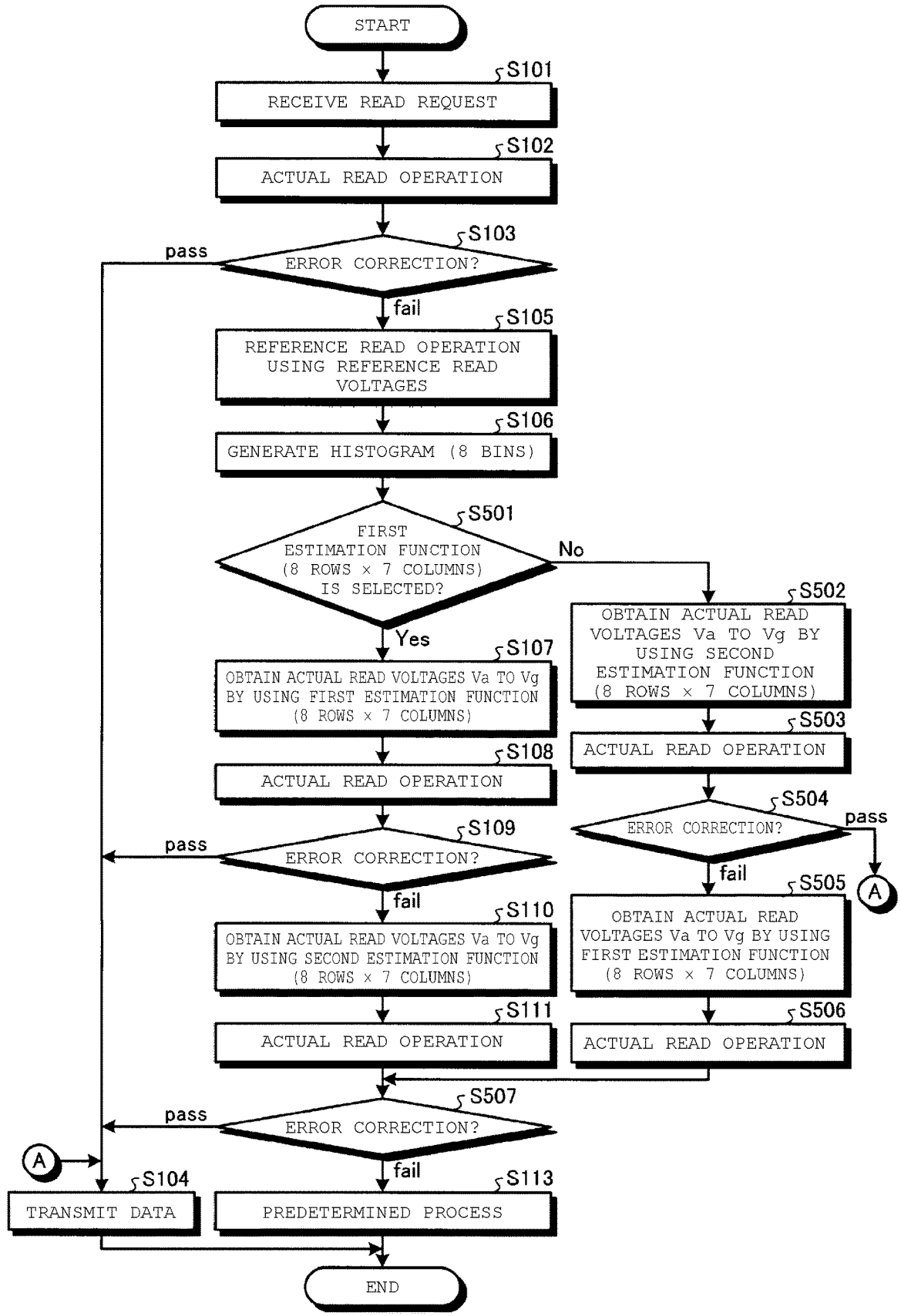
FIG. 12 is a flowchart for illustrating an operation example of a memory system according to a fifth embodiment.

FIG. 12 is a flowchart for illustrating an operation example of the memory system 1 according to the fifth embodiment. The same processes as those of the first embodiment are denoted by the same step numbers as those of the first embodiment, and detail description thereof will be omitted.

First, in the same manner as the first embodiment, the processes in S101 to S106 are executed. When a histogram is obtained by the process in S106, the memory controller 200 (for example, the CPU 203) determines whether or not to select the first estimation function 301 between the first estimation function 301 and the second estimation function 302 based on the histogram obtained by the process in S106 (S501). A determination method in S501 is not limited to a specific method. The determination method in S501 may be the same as the determination method in S401 according to the fourth embodiment.

When it is determined that the first estimation function 301 is selected (Yes in S501), the processes in S107 to S113 are executed. That is, the memory controller 200 (for example, the CPU 203) obtains the actual read voltages Va to Vg by using the first estimation function 301 (S107) and executes an actual read operation using the actual read voltages Va to Vg (S108). The memory controller 200 may obtain the actual read voltages Va to Vg using the second estimation function 302 (S110) according to the result of error correction for obtained data (S109).

When it is determined that the first estimation function 301 is not selected (No in S501), the memory controller 200 (for example, the CPU 203) obtains the actual read voltages Va to Vg by using the second estimation function 302 (S502) and executes the actual read operation using the actual read voltages Va to Vg (S503). In the same manner as the process in S103, the error correction is performed on the data obtained from the NAND memory 100 in the process in S503 (S504).

When the error correction is successful (pass in S504), the memory controller 200 executes the process in S104. When the error correction fails (fail in S504), the memory controller 200 (for example, the CPU 203) obtains the actual read voltages Va to Vg by using the first estimation function 301 (S505) and executes the actual read operation using the actual read voltages Va to Vg (S506). In the same manner as the process in S103, the error correction is performed on the data obtained from the NAND memory 100 in the process in S506 (S507).

When the error correction is successful (pass in S507), the memory controller 200 executes the process in S104. When the error correction fails (fail in S507), the memory controller 200 (for example, the CPU 203) executes a predetermined process (S113) and terminates the operation.

In this manner, the memory controller 200 may be configured to use another estimation function when error correction using a first selected estimation function fails.

Sixth Embodiment

In the third embodiment, whether or not to skip some subsequent processes is determined based on a histogram. A method of determining whether or not to skip some subsequent processes is not limited to determination using the histogram.

As an example, the memory controller 200 according to a sixth embodiment is configured to skip subsequent processes based on an actual read voltage obtained by estimation.

Figure 13:
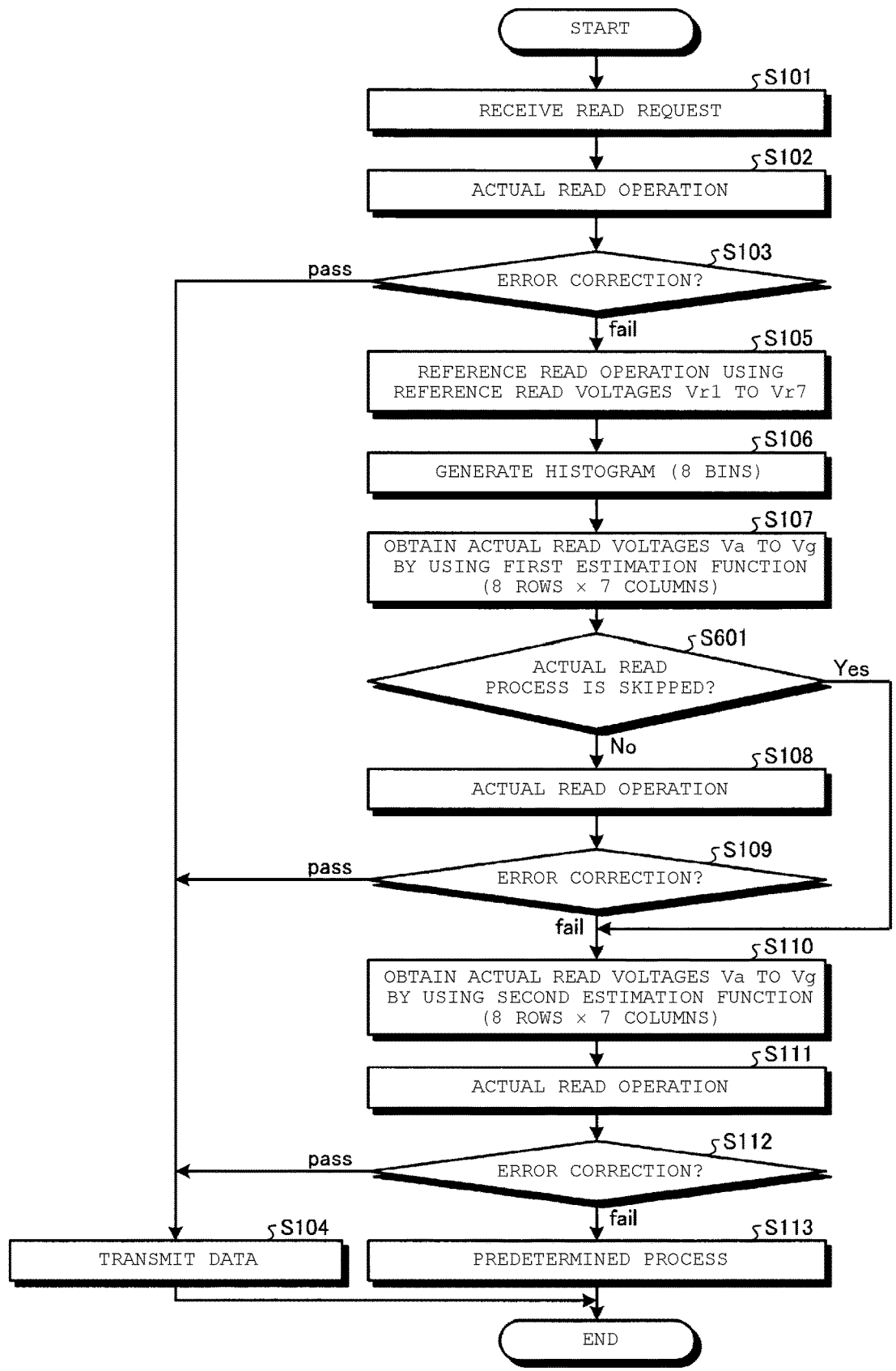
FIG. 13 is a flowchart for illustrating an operation example of a memory system according to a sixth embodiment.

FIG. 13 is a flowchart for illustrating an operation example of the memory system 1 according to the sixth embodiment. The same processes as those of the first embodiment are denoted by the same step numbers as those of the first embodiment, and detail description thereof will be omitted.

First, in the same manner as the first embodiment, the processes in S101 to S107 are executed. When the actual read voltages Va to Vg are obtained by using the first estimation function 301 (S107), the memory controller 200 (for example, the CPU 203) determines whether or not to skip an actual read operation using the actual read voltages Va to Vg (S601). A determination method in S601 is not limited to a specific method.

In one example, the CPU 203 determines whether or not all of the actual read voltages Va to Vg are within a predetermined range. The predetermined range is, for example, a range in which the peripheral circuit 110 may set a read voltage. When any one (for example, Va or Vg) of the actual read voltages Va to Vg obtained by the first estimation function 301 deviates from the range in which the peripheral circuit 110 may set the read voltage, an actual read operation using the actual read voltages Va to Vg cannot be executed. In this case, the CPU 203 determines to skip the actual read operation. When all of the actual read voltages Va to Vg are within the predetermined range, the CPU 203 determines not to skip the actual read operation. A method of determining whether or not to skip the actual read operation is not limited to this method.

When it is determined that the actual read operation is skipped (Yes in S601), an actual read operation using the actual read voltages Va to Vg obtained by the process in S107 (S108), and an error correction process on data obtained by the actual read operation (S109) are skipped, and a process of obtaining the actual read voltages Va to Vg using the second estimation function 302 is executed (S110). Thereafter, the processes in S111 to S113 are executed.

When it is determined that the actual read operation is not skipped (No in S601), the processes in S108 to S113 are executed.

In this manner, the memory controller 200 may determine whether or not to skip the actual read operation and execute estimation using another estimation function based on one or more actual read voltages obtained by estimation.

Accordingly, in the same manner as the third embodiment, it is possible to reduce a total time required for processing a read request.

Seventh Embodiment

If the number of bins of a histogram which is a source of estimation is increased, estimation with more high accuracy can be performed. Meanwhile, in order to generate a histogram having a large number of bins, the number of times a read operation is executed in accordance with the number of bins is required for a reference read operation. That is, more time is required for the reference read operation.

In a seventh embodiment, the memory controller 200 is configured to use a first histogram having a small number of bins for first estimation and use a second histogram having a larger number of bins than the first estimation for second estimation. Accordingly, during the first estimation, a time required for the reference read operation is shortened, and during the second estimation, estimation with more high accuracy is performed.

Figure 14:
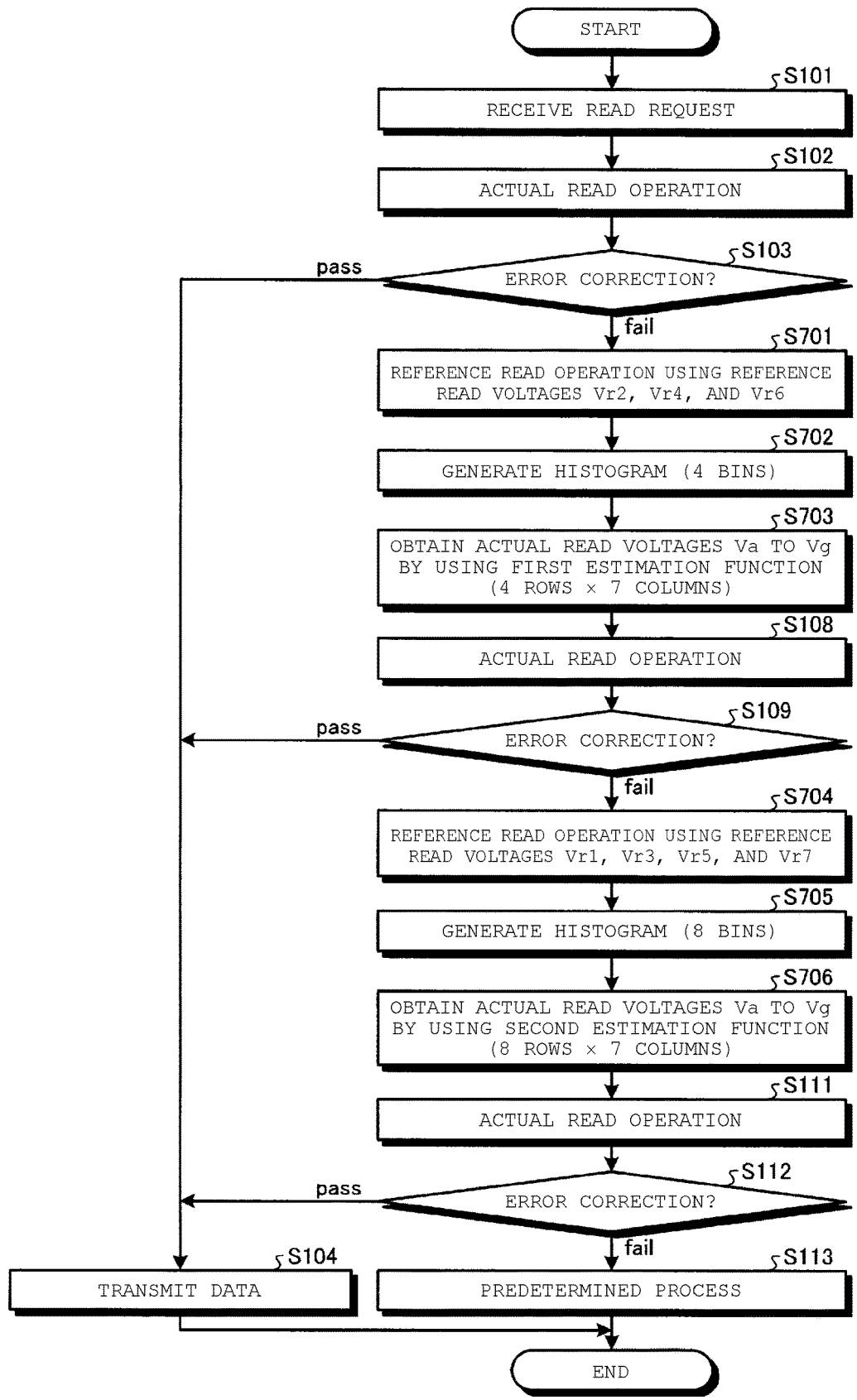
FIG. 14 is a flowchart for illustrating an operation example of a memory system according to a seventh embodiment.

FIG. 14 is a flowchart for illustrating an operation example of the memory system 1 according to the seventh embodiment. The same processes as those of the first embodiment are denoted by the same step numbers as those of the first embodiment, and detail description thereof will be omitted.

First, in the same manner as the first embodiment, the processes in S101 to S104 are executed. When error correction fails in S103 (fail in S103), the memory controller 200 executes a reference read operation using the reference read voltages Vr2, Vr4, and Vr6 (S701). Specifically, the memory controller 200 designates different values of Vr2, Vr4, and Vr6 as read voltages, and executes three read operations in total. The memory controller 200 stores three pieces of data obtained by the three read operations, for example, in the RAM 202. These three pieces of data are referred to as a result of a first reference read operation.

Next, the memory controller 200 (for example, the CPU 203) generates a histogram having 4 bins based on the result of the first reference read operation (S702). The memory controller 200 (for example, the CPU 203) obtains the actual read voltages Va to Vg by using the first estimation function 301 (S703).

In the seventh embodiment, the number of bins of a histogram multiplied by the first estimation function 301 is 4. In the same manner as the first embodiment, the number of actual read voltages estimated by the first estimation function 301 is 7. The first estimation function 301 according to the seventh embodiment is configured as a matrix having 4 rows and 7 columns. The CPU 203 multiplies a vector having a frequency of each bin of the histogram obtained by the process in S702 as an element by the first estimation function 301, so it is possible to obtain a vector having each of the actual read voltages Va to Vg as an element.

Next, the memory controller 200 executes the actual read operation again by using the actual read voltages Va to Vg obtained by the process in S703 (S108). In the same manner as the process in S103, the error correction is performed on the data obtained from the NAND memory 100 in the process in S108 (S109).

When the error correction is successful (pass in S109), the memory controller 200 executes the process in S104. When the error correction fails (fail in S109), the memory controller 200 executes the reference read operation using the voltages Vr1, Vr3, Vr5, and Vr7 not used for the first reference read operation among the reference read voltages Vr1 to Vr7 (S704). Specifically, the memory controller 200 designates different values of Vr1, Vr3, Vr5, and Vr7 as read voltages, and executes four read operations in total. The memory controller 200 stores four pieces of data obtained by the four read operations, for example, in the RAM 202. These four pieces of data are referred to as a result of a second reference read operation.

By obtaining the result of the first reference read operation and the result of the second reference read operation, seven pieces of data equivalent to the case of performing the reference read operation according to the first embodiment are obtained. That is, the seven pieces of data are a group of pieces of data obtained by using different values of Vr1 to Vr7 as read voltages. The memory controller 200 (for example, the CPU 203) generates a histogram having 8 bins based on the result of the first reference read operation and the result of the second reference read operation (S705).

The memory controller 200 (for example, the CPU 203) obtains the actual read voltages Va to Vg by using the second estimation function 302 (S706).

In the seventh embodiment, the number of bins of a histogram multiplied by the second estimation function 302 is 8. The number of actual read voltages estimated by the second estimation function 302 is 7. The second estimation function 302 according to the seventh embodiment is configured as a matrix having 8 rows and 7 columns. The second estimation function 302 according to the seventh embodiment may be the same as the second estimation function 302 according to the first embodiment. The CPU 203 multiplies a vector having a frequency of each bin of the histogram obtained by the process in S705 as an element by the first estimation function 301, so it is possible to obtain a vector having each of the actual read voltages Va to Vg as an element.

Next, the memory controller 200 (for example, the CPU 203) executes the actual read operation again by using the actual read voltages Va to Vg obtained by the process in S706 (S111). In the same manner as the process in S103, the error correction is performed on the data obtained from the NAND memory 100 in the process in S111 (S112).

When the error correction is successful (pass in S112), the memory controller 200 executes the process in S104. When the error correction fails (fail in S112), the memory controller 200 executes a predetermined process (S113) and terminates the operation.

In this manner, the memory controller 200 is configured to use a first histogram having a small number of bins for first estimation and use second histogram having a larger number of bins than the first histogram for second estimation. During the second estimation, the memory controller 200 obtains a histogram based on the result of the reference read operation at the first estimation (the result of the first reference read operation) and the result of the additionally executed reference read operation (the result of the second reference read operation)

Accordingly, during the first estimation, a time required for the reference read operation is shortened, and during the second estimation, estimation with more high accuracy is performed.

When the memory controller 200 is configured to sequentially use three or more estimation functions, the memory controller 200 may use the first histogram for i-th estimation and use the second histogram for (i+1)-th estimation. Here, i is an integer equal to or larger than 2.

Eighth Embodiment

In the first to seventh embodiments, the first estimation function 301 and the second estimation function 302 have the matrix configuration. One or both of the first estimation function 301 and the second estimation function 302 may not have the matrix configuration.

Figure 15:
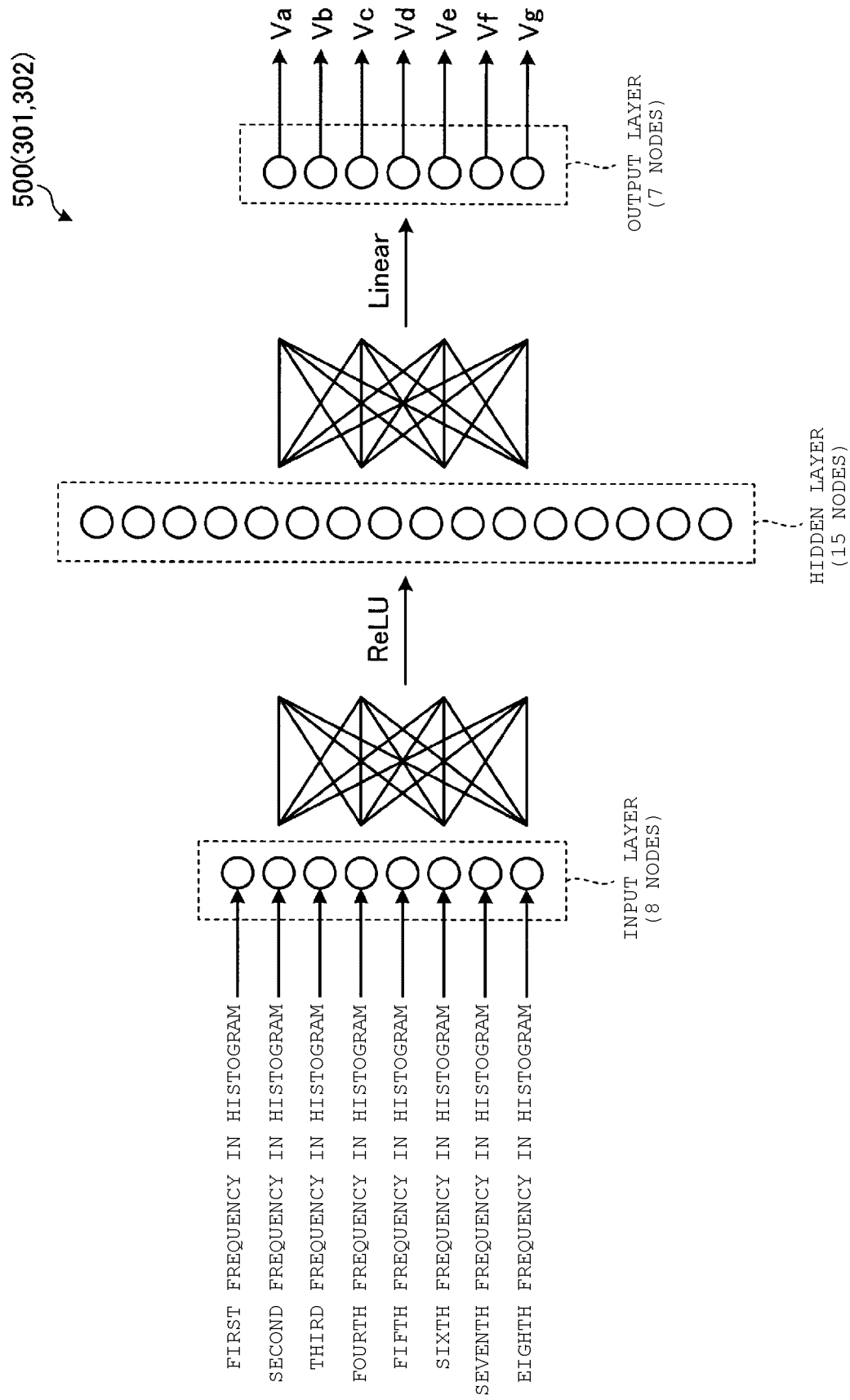
FIG. 15 is a schematic diagram for illustrating an example of a configuration of a first estimation function and a second estimation function according to an eighth embodiment.

FIG. 15 is a schematic diagram for illustrating an example of a configuration of the first estimation function 301 and the second estimation function 302 according to an eighth embodiment. As illustrated in FIG. 15, in the eighth embodiment, the first estimation function 301 and the second estimation function 302 are both neural network models 500.

In the example in FIG. 15, the neural network model 500 has a configuration of a multi-layer perceptron (MLP) having one hidden layer. The neural network model 500 may be a fully connected MLP or a non-fully connected MLP (a sparsely connected MLP). An activation function used for the hidden layer is, for example, a rectified linear units (ReLUs) function, and the activation function used for an output layer is, for example, a linear function.

A histogram is input to an input layer of the neural network model 500. That is, the input layer includes a number of nodes (that is, eight) corresponding to the number of bins in the histogram as nodes to which the histogram is input. The output layer of the neural network model 500 includes a number of nodes (that is, 7) corresponding to the number of actual read voltages Va to Vg. The hidden layer includes one or more nodes. In the example in FIG. 15, the hidden layer includes 15 nodes.

In the hidden layer and the output layer, each node multiplies each input value from nodes of bias and previous layers by a weight and applies the activation function to a sum of each value after the weight is multiplied so as to output a value obtained by applying the activation function.

Each weight is predetermined by training. That is, the neural network model 500 is trained in advance so as to map a histogram to optimum values of the actual read voltages Va to Vg. For example, the first estimation function 301 is trained by using a pair of a histogram and a set of optimum values of the actual read voltage obtained under the stress condition within the range 311, as learning data. Further, the second estimation function 302 is trained by using a pair of a histogram and a set of optimum values of the actual read voltage obtained under the stress condition within the range 312, as learning data. The example of learning data is not limited to this.

In this manner, each of the first estimation function 301 and the second estimation function 302 may be a neural network model instead of the matrix. One of the first estimation function 301 and the second estimation function 302 may be a matrix, and the other may be a neural network model.

Further, data input to the input layer is not limited to the histogram. Various data such as temperature information, a stress condition, or the like may be input.

Ninth Embodiment

In the third to sixth embodiments, an actual read voltage obtained by a histogram or estimation is used as a reference for determining whether or not to skip processes or selecting an estimation function. The reference for determining whether or not to skip the processes or selecting the estimation function is not limited thereto.

For example, the memory controller 200 records various management information so as to normally operate the memory system 1. The memory controller 200 may determine whether or not to skip the processes or select the estimation function based on the management information.

FIG. 16 is a diagram illustrating an example of a configuration of management information recorded by the memory controller 200 according to a ninth embodiment. As illustrated in FIG. 16, the management information 600 includes the number of executions of a program and erase cycle, the number of executions of a read operation, an elapsed time since being programmed, or a temperature. The number of executions of the program and erase cycle, the number of executions of the read operation, and the elapsed time since being programmed are recorded for each predetermined storage area (for example, page or block). The temperature is obtained by, for example, a temperature sensor (not illustrated) provided in the memory system 1.

The management information 600 is stored in, for example, the RAM 202, and the memory controller 200 may update the management information 600 on the RAM 202 at any timing. Further, the memory controller 200 can timely save the management information 600 on the RAM 202 into a non-volatile memory such as the NAND memory 100 or the like in preparation for power interrupt. The memory controller 200 may determine whether or not to skip processes or select an estimation function based on the information recorded in the management information 600.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a plurality of memory cells in which data is stored; and
a memory controller that is configured to:
execute a first reference read operation of performing a read on the plurality of memory cells by using one or more first reference read voltages,
execute a first counting process of generating a first histogram indicating a number of memory cells in different threshold voltage bins based on a result of the first reference read operation,
execute a first estimation process of estimating one or more actual read voltages based on the first histogram and a first estimation function,
execute a first actual read operation of reading the data by using the one or more actual read voltages estimated by the first estimation process, and
execute a second estimation process and a second actual read operation when the first actual read operation fails,
wherein the second estimation process is a process of estimating the one or more actual read voltages by using a second estimation function different from the first estimation function, and
the second actual read operation is a process of reading the data by using the one or more actual read voltages estimated by the second estimation process.

2. The memory system according to claim 1,
wherein in the second estimation process, the memory controller estimates at least one of the one or more actual read voltages based on the first histogram and the second estimation function.

3. The memory system according to claim 1,
wherein the memory controller is further configured to determine whether or not to skip the first estimation process and the first actual read operation based on the first histogram.

4. The memory system according to claim 1,
the memory controller is further configured to determine whether or not to skip the first actual read operation based on the one or more actual read voltages estimated by the first estimation process.

5. The memory system according to claim 1, wherein the memory controller is further configured to:
execute a second reference read operation and a second counting process when the first actual read operation fails, and wherein
the second reference read operation is a process of performing a read on the plurality of memory cells by using one or more second reference read voltages different from the one or more first reference read voltages,
the second counting process is a process of generating a second histogram having more threshold voltage bins than the first histogram based on the result of the first reference read operation and a result of the second reference read operation, and
in the second estimation process, the memory controller estimates the one or more actual read voltages based on the second histogram and the second estimation function.

6. The memory system according to claim 1, wherein the memory system is connected to a host, and the memory controller is configured to:
execute a third actual read operation of reading the data according to a read command from the host, and
execute the first reference read operation when the third actual read operation fails.

7. A memory system comprising:
a plurality of memory cells in which data is stored; and
a memory controller that is configured to execute:
a counting process of generating a histogram indicating a number of memory cells in different threshold voltage bins by performing a read on the plurality of memory cells by using one or more reference read voltages,
a selection process of selecting one of a plurality of estimation functions,
a first estimation process of estimating one or more actual read voltages based on the histogram and a first estimation function, which is an estimation function selected by the selection process, and
a first actual read operation of reading the data by using the one or more actual read voltages estimated by the first estimation process.

8. The memory system according to claim 7, wherein the memory controller is configured to:
execute a second estimation process and a second actual read operation when the first actual read operation fails, and wherein
the second estimation process is a process of estimating the one or more actual read voltages by using a second estimation function different from the first estimation function among the plurality of estimation functions, and
the second actual read operation is a process of reading the data by using the one or more actual read voltages estimated by the second estimation process.

9. The memory system according to claim 7,
wherein in the selection process, the memory controller selects the first estimation function based on the histogram.

10. The memory system according to claim 7, wherein in the selection process, the memory controller selects the first estimation function based on at least one of: a number of executions of a program and erase cycle on the plurality of memory cells, a number of executions of a read operation for the data on the plurality of memory cells, an elapsed time since the data has been programmed into the plurality of memory cells, and a temperature.

11. The memory system according to claim 7, wherein the memory system is connected to a host, and the memory controller is configured to:
execute a third actual read operation of reading the data according to a read command from the host, and
execute the counting process when the third actual read operation fails.

12. A method of performing a read operation in a memory system that includes a plurality of memory cells in which data is stored, said method comprising:
executing a first reference read operation of performing a read on the plurality of memory cells by using one or more first reference read voltages;

executing a first counting process of generating a first histogram indicating a number of memory cells in different threshold voltage bins based on a result of the first reference read operation, executing a first estimation process of estimating one or more actual read voltages based on the first histogram and a first estimation function, executing a first actual read operation of reading the data by using the one or more actual read voltages estimated by the first estimation process, and executing a second estimation process and a second actual read operation when the first actual read operation fails, wherein the second estimation process is a process of estimating the one or more actual read voltages by using a second estimation function different from the first estimation function, and the second actual read operation is a process of reading the data by using the one or more actual read voltages estimated by the second estimation process.

13. The method according to claim 12, wherein in the second estimation process, at least one of the one or more actual read voltages is estimated based on the first histogram and the second estimation function.

14. The method according to claim 12, further comprising:

prior to executing the first estimation process and the first actual read operation, determining whether or not to skip the first estimation process and the first actual read operation based on the first histogram.

15. The method according to claim 12, further comprising:

prior to executing the first actual read operation, determining whether or not to skip the first actual read operation based on the one or more actual read voltages estimated by the first estimation process.

16. The method according to claim 12, further comprising:

executing a second reference read operation and a second counting process when the first actual read operation fails, wherein the second reference read operation is a process of performing a read on the plurality of memory cells by using one or more second reference read voltages different from the one or more first reference read voltages, the second counting process is a process of generating a second histogram having more threshold voltage bins than the first histogram based on the result of the first reference read operation and a result of the second reference read operation, and in the second estimation process, the one or more actual read voltages is estimated based on the second histogram and the second estimation function.

17. The method according to claim 12, further comprising:

prior to executing the first reference read operation, executing a third actual read operation of reading the data according to a read command from the host, wherein the first reference read operation is executed when the third actual read operation fails.

\* \* \* \* \*